United States Patent
Lee et al.

(10) Patent No.: US 7,408,597 B2
(45) Date of Patent: Aug. 5, 2008

(54) LIQUID CRYSTAL DISPLAY DEVICE AND METHOD FOR FABRICATING THE SAME

(75) Inventors: Ji No Lee, Goyang-si (KR); Hee Young Kwack, Seoul (KR); Chang Bin Lee, Busan (KR)

(73) Assignee: LG Display Co., Ltd., Seoul (KR)

( * ) Notice: Subject to any disclaimer, the term of this patent is extended or adjusted under 35 U.S.C. 154(b) by 353 days.

(21) Appl. No.: 11/269,817

(22) Filed: Nov. 9, 2005

(65) Prior Publication Data

US 2006/0145161 A1 Jul. 6, 2006

(30) Foreign Application Priority Data

Dec. 31, 2004 (KR) .................... 10-2004-0118566

(51) Int. Cl.
*G02F 1/136* (2006.01)
(52) U.S. Cl. ...................................... 349/43
(58) Field of Classification Search .................... 349/43
See application file for complete search history.

(56) References Cited

U.S. PATENT DOCUMENTS

| | | | |
|---|---|---|---|
| 5,162,933 A | 11/1992 | Kakuda et al. | |
| 5,317,433 A | 5/1994 | Miyawaki et al. | |
| 5,339,181 A | 8/1994 | Kim et al. | |
| 5,462,887 A | 10/1995 | Glück | |
| 5,668,379 A | 9/1997 | Ono et al. | |
| 5,731,856 A | 3/1998 | Kim et al. | |
| 5,771,083 A | 6/1998 | Fujihara et al. | |
| 5,793,460 A | 8/1998 | Yang | |
| 5,847,781 A | 12/1998 | Ono et al. | |
| 7,095,460 B2 * | 8/2006 | Choi et al. | 349/43 |
| 7,190,419 B2 * | 3/2007 | Park | 349/43 |

* cited by examiner

*Primary Examiner*—David C. Nelms
*Assistant Examiner*—Phu Vu
(74) *Attorney, Agent, or Firm*—McKenna Long & Aldridge LLP

(57) ABSTRACT

A liquid crystal display device according to the present invention includes a gate line on a substrate; a data line crossing the gate line with a gate insulating film to define a pixel area; a thin film transistor connected to the gate line and the data line; a semiconductor pattern overlapped along the data line; a double layer passivation film covering the data line and the thin film transistor, wherein layers of the passivation film have different etching rates; and a pixel electrode formed in a pixel hole penetrating an upper passivation film of the double layer passivation film and connected to a drain electrode of the thin film transistor exposed through a drain contact hole, the pixel electrode forming a border with the upper passivation film surrounding the pixel hole.

84 Claims, 36 Drawing Sheets

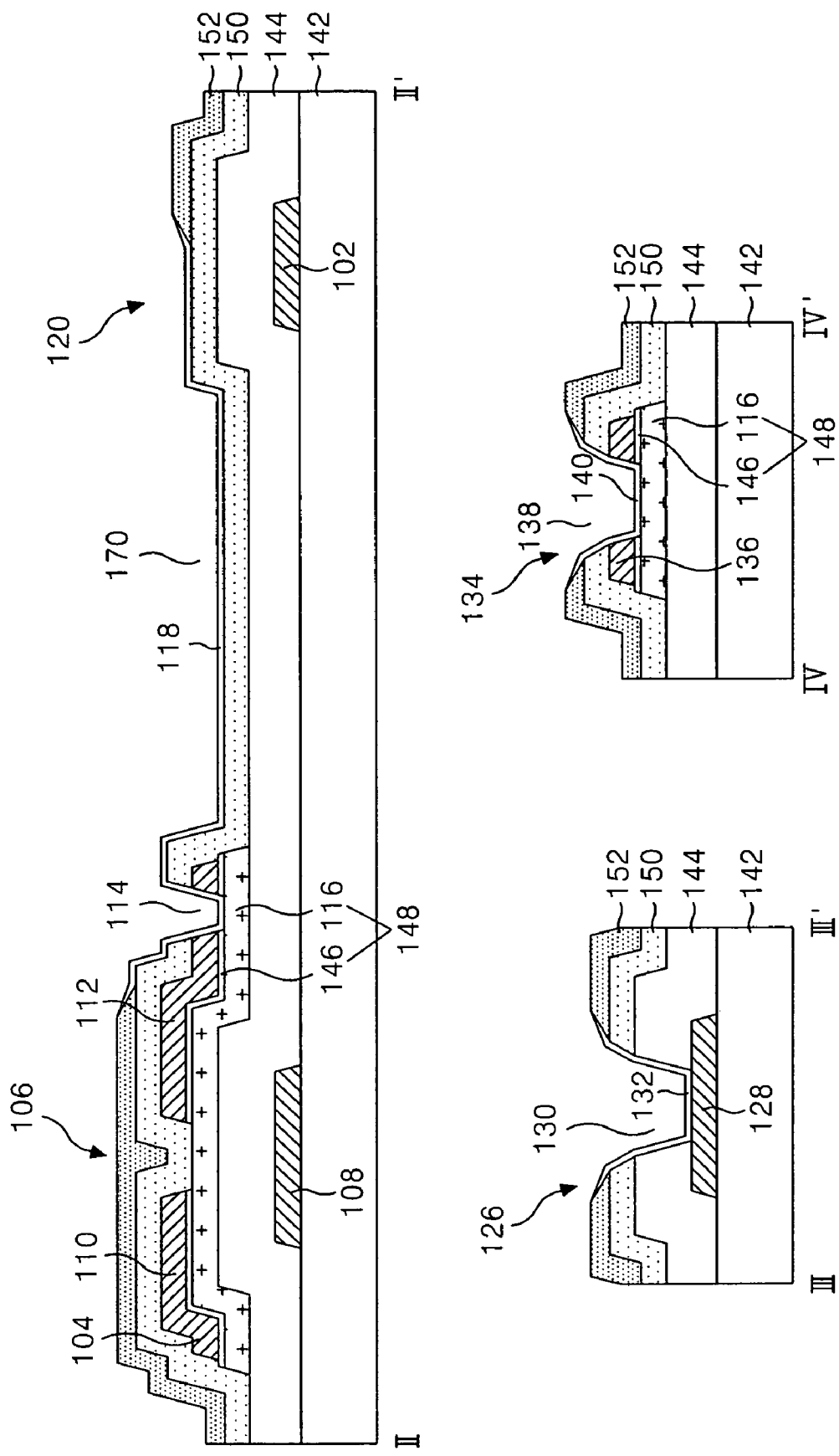

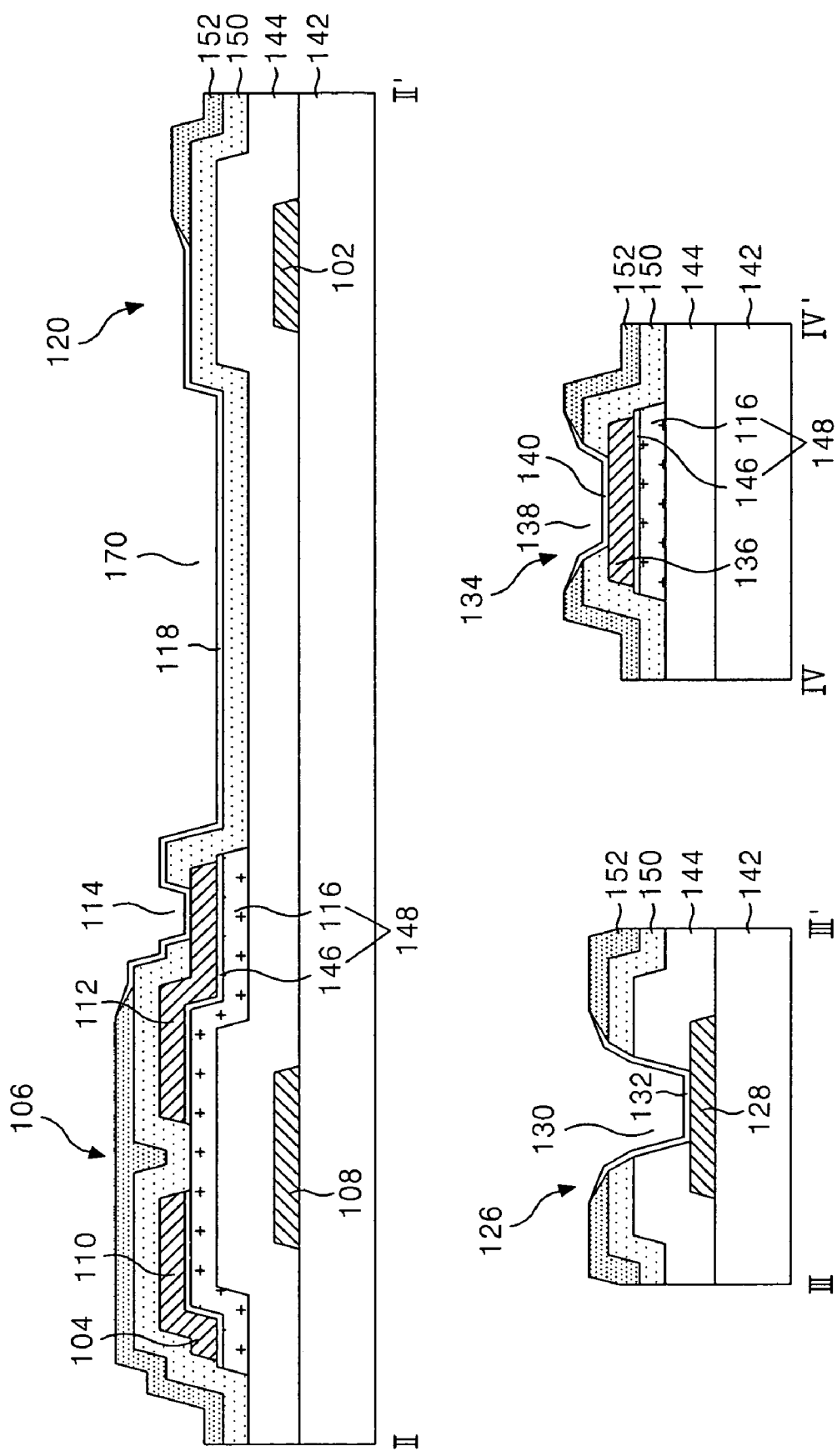

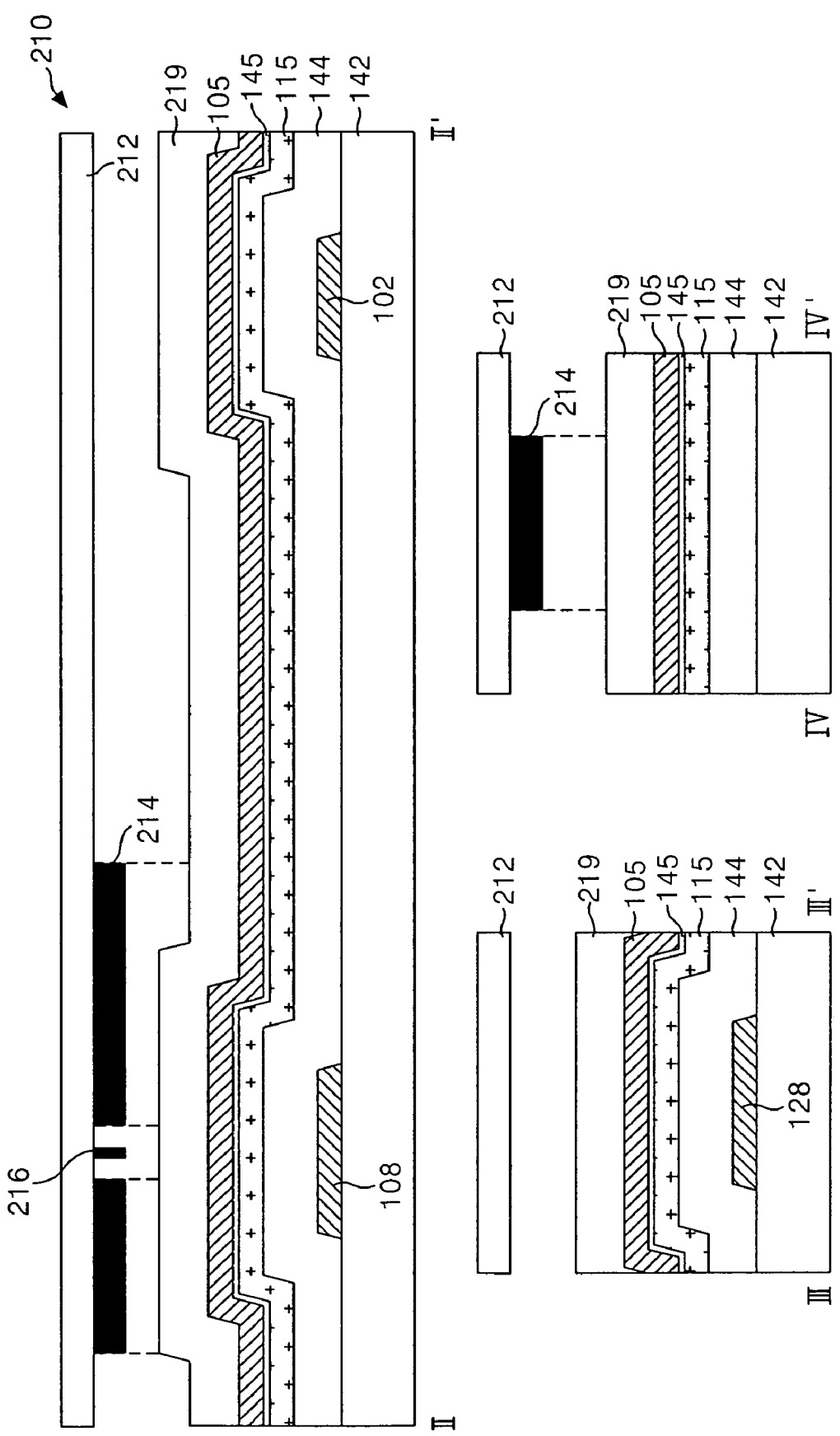

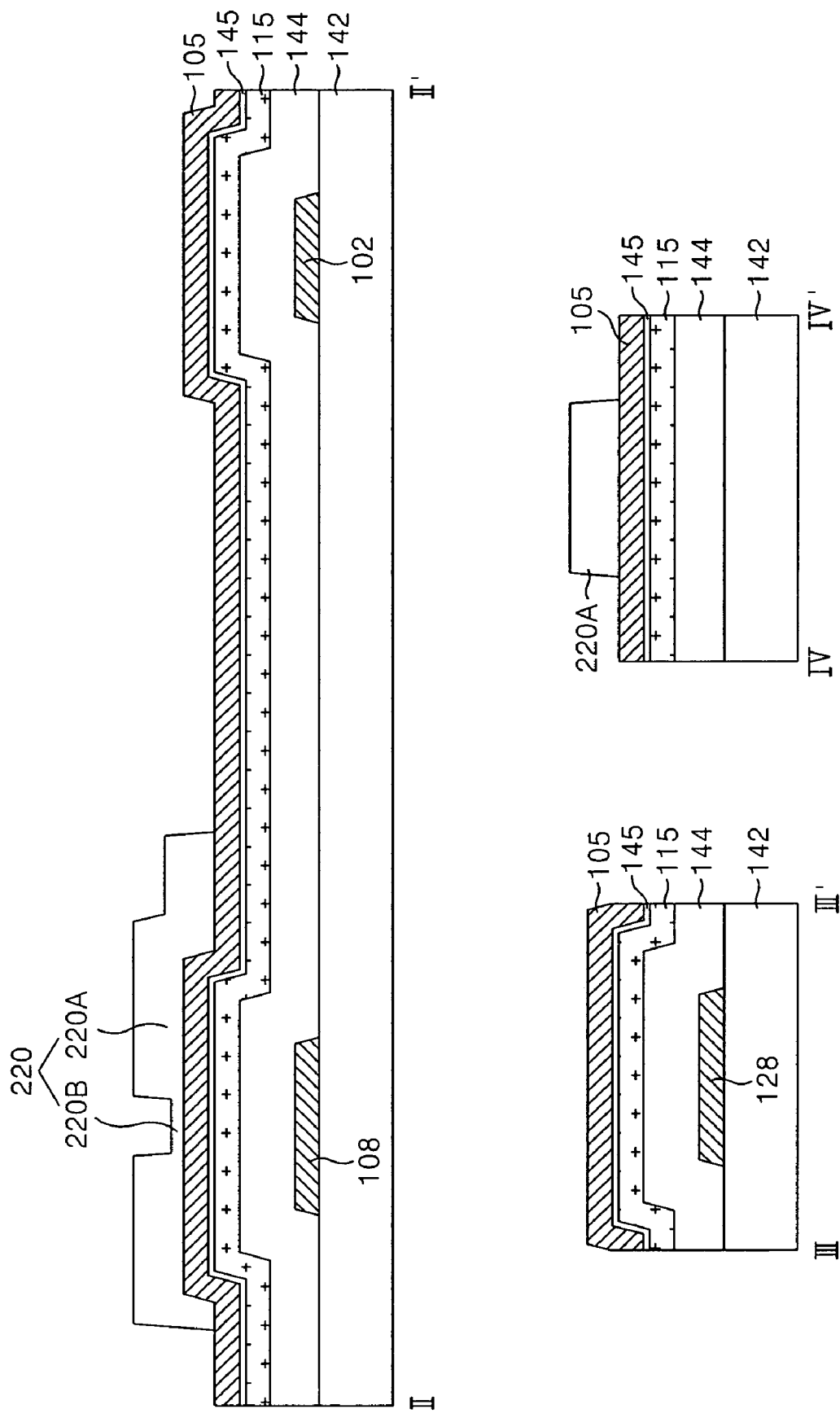

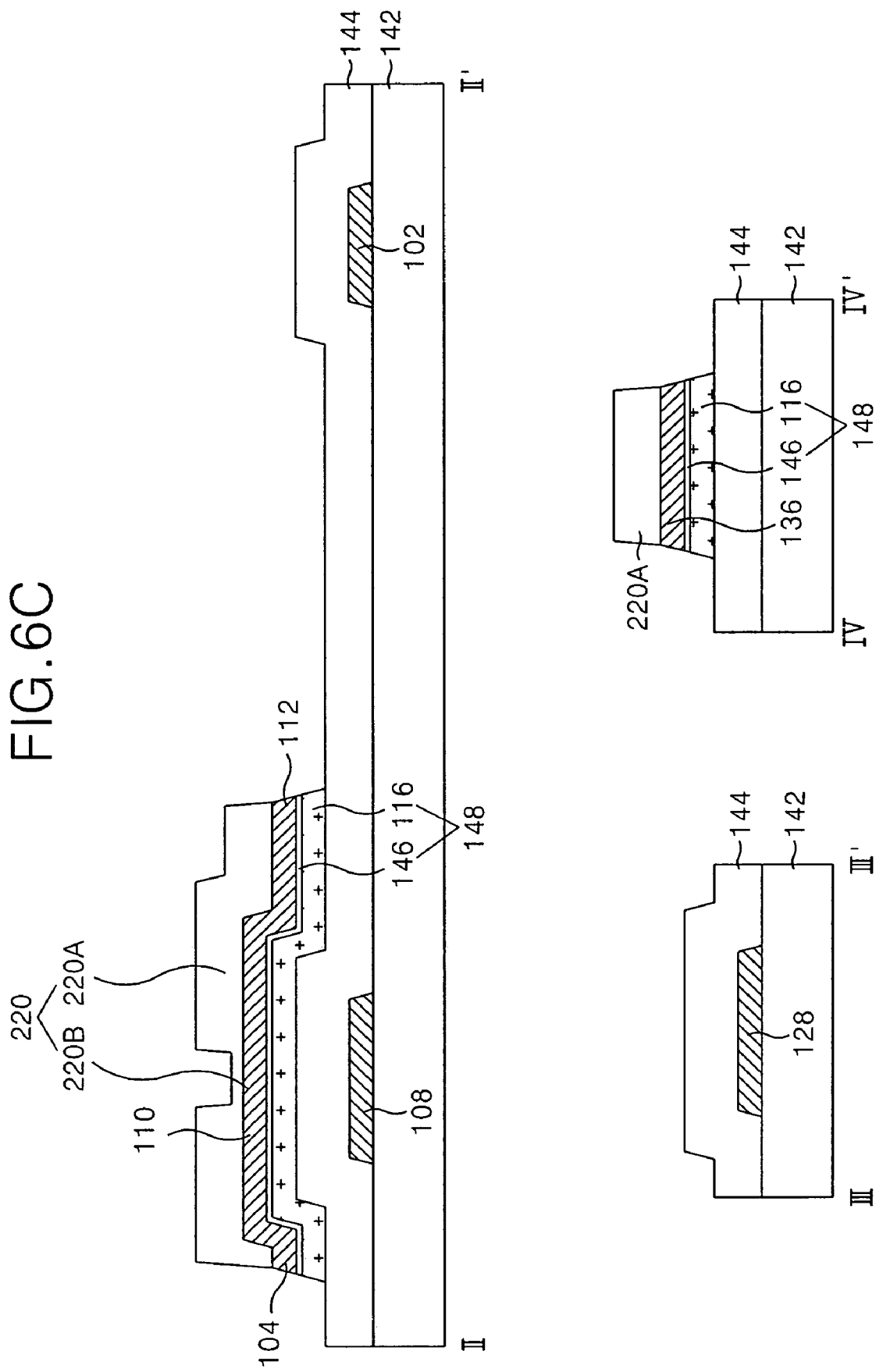

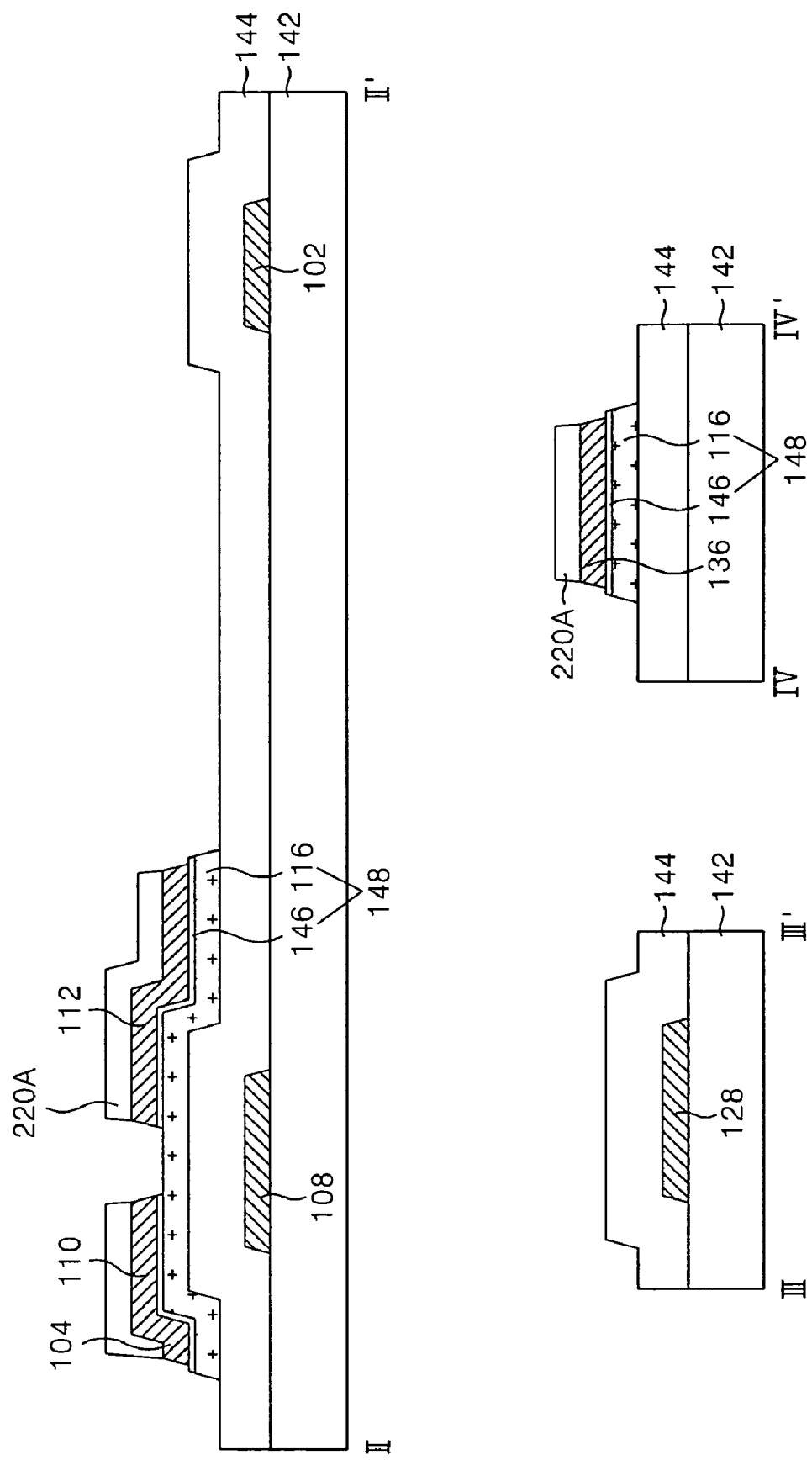

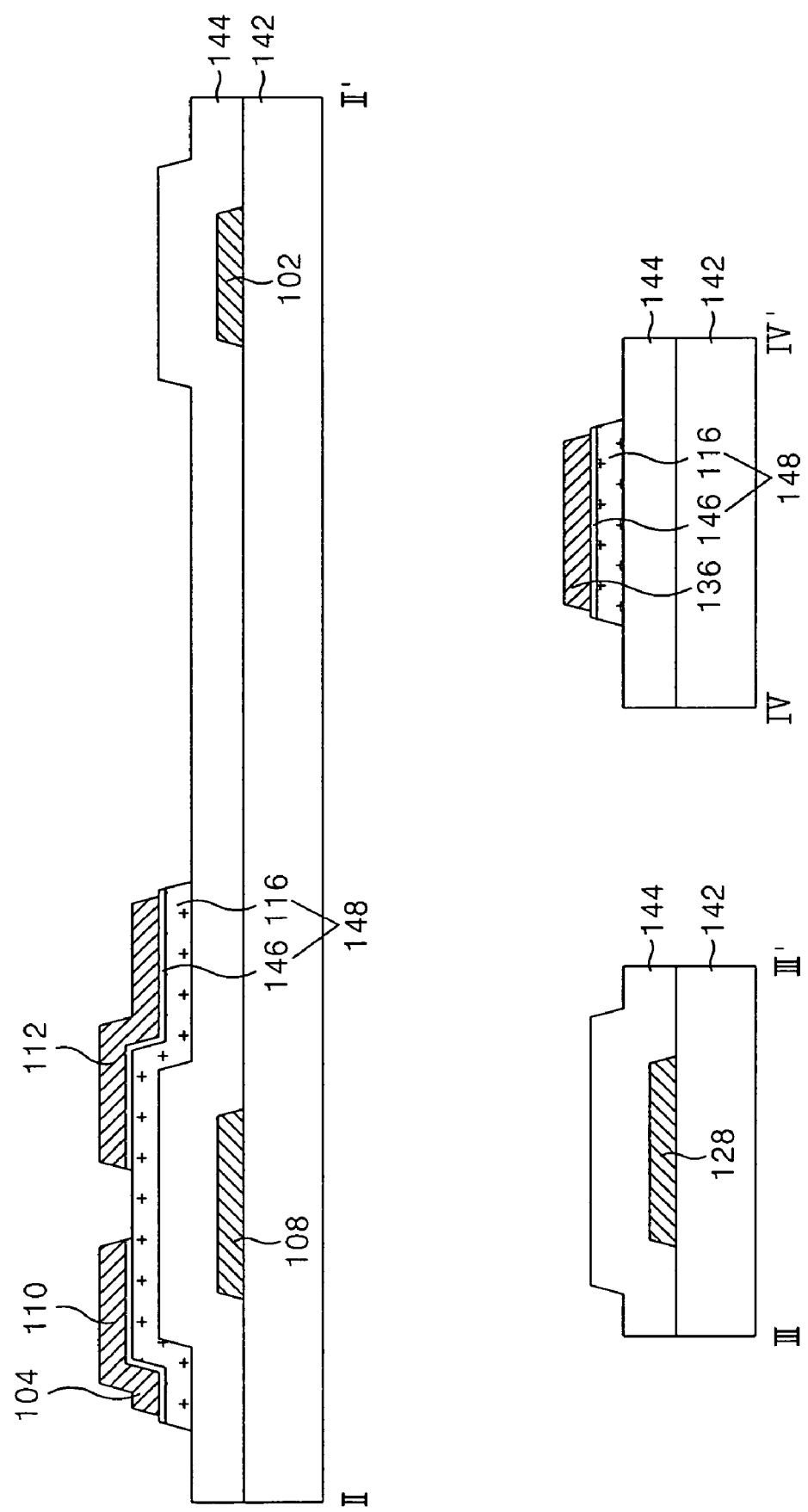

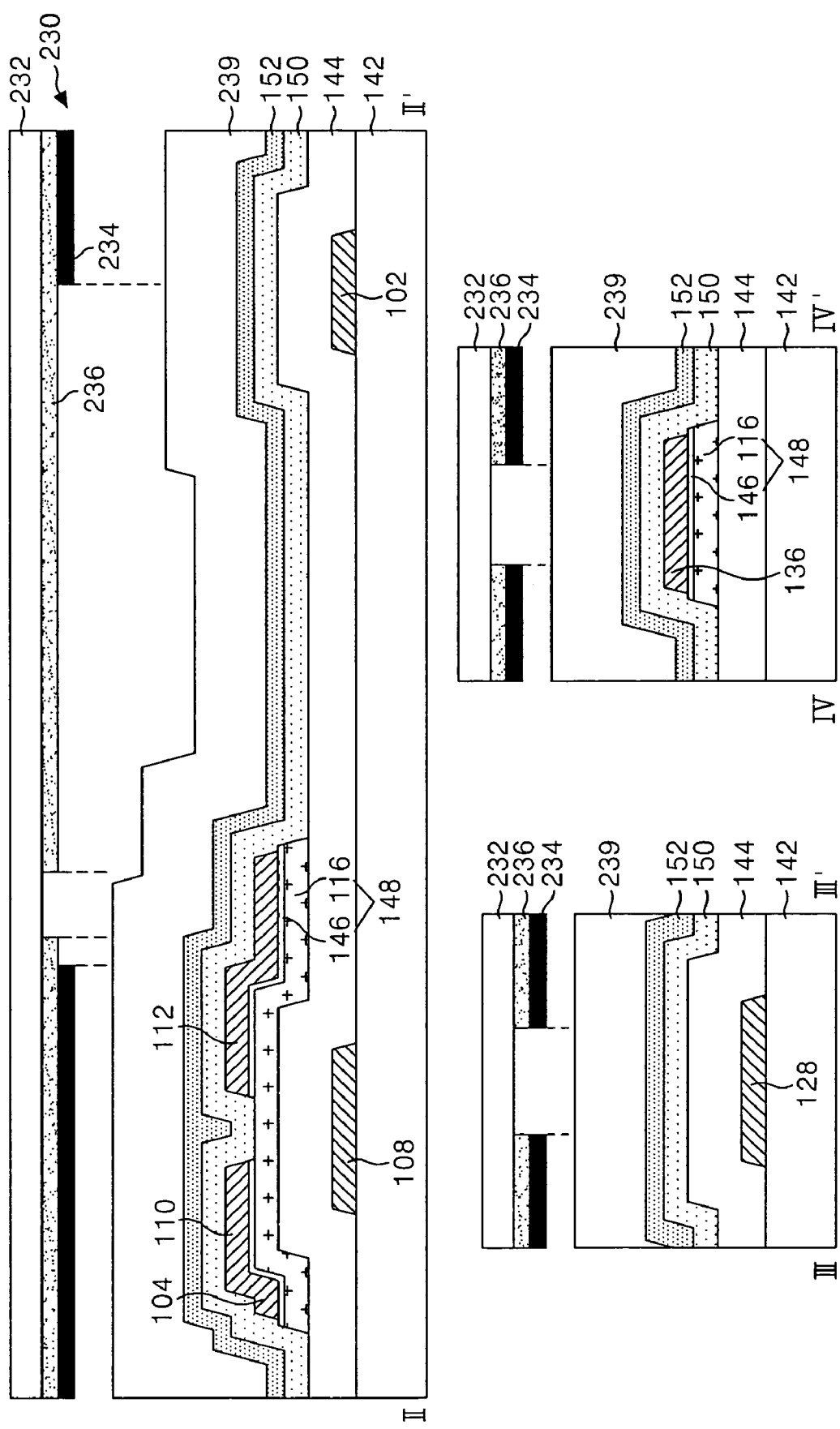

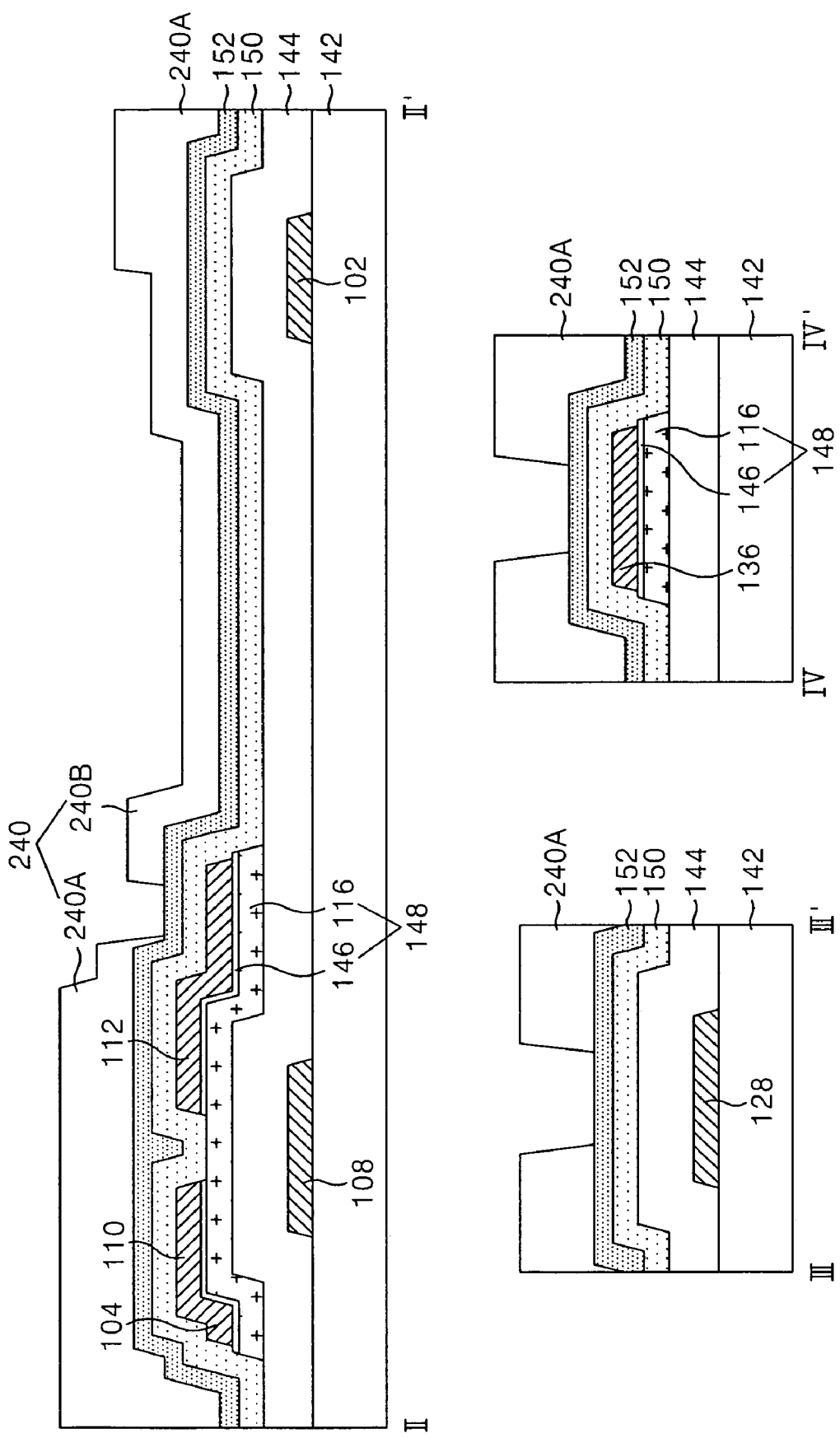

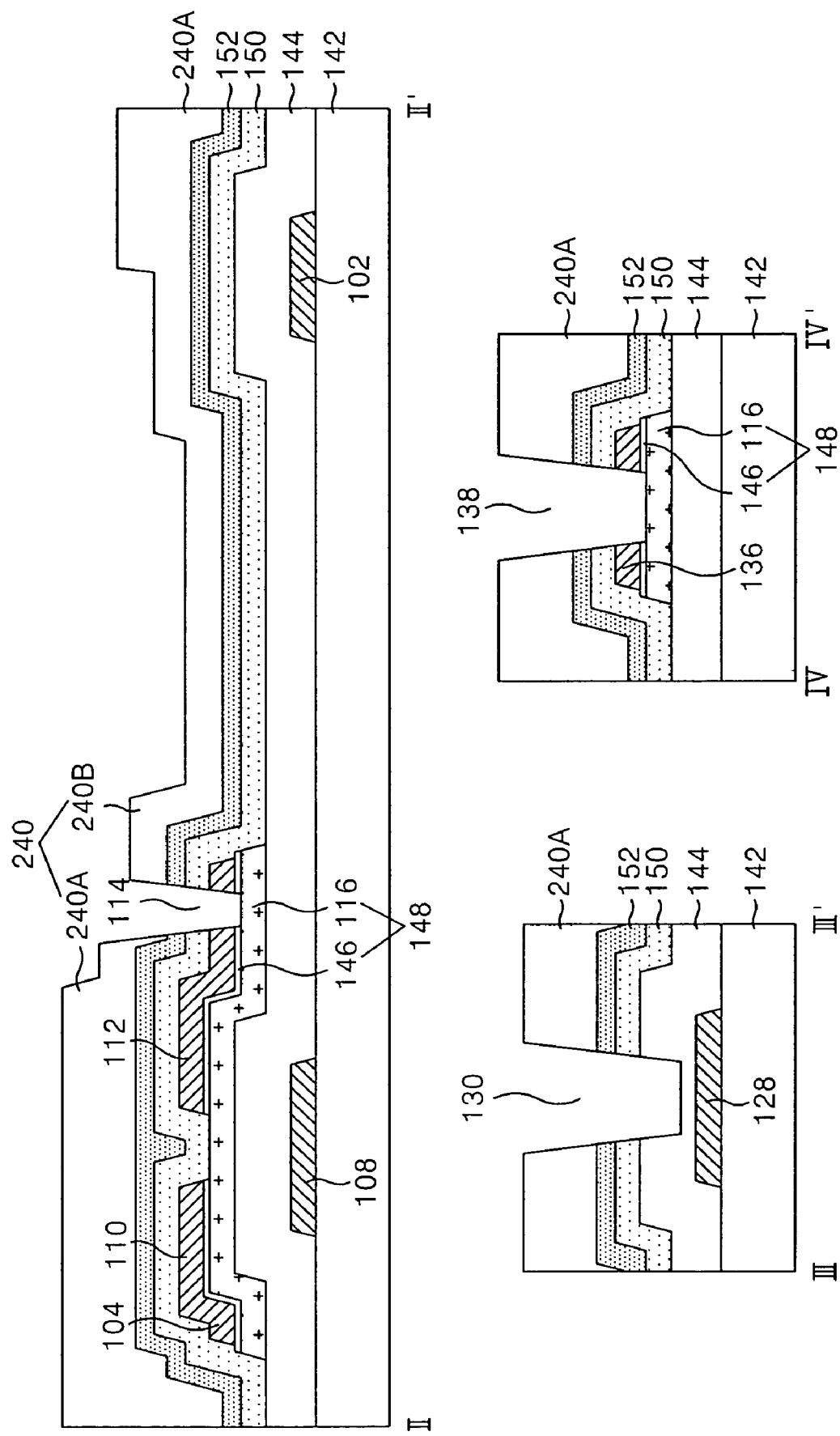

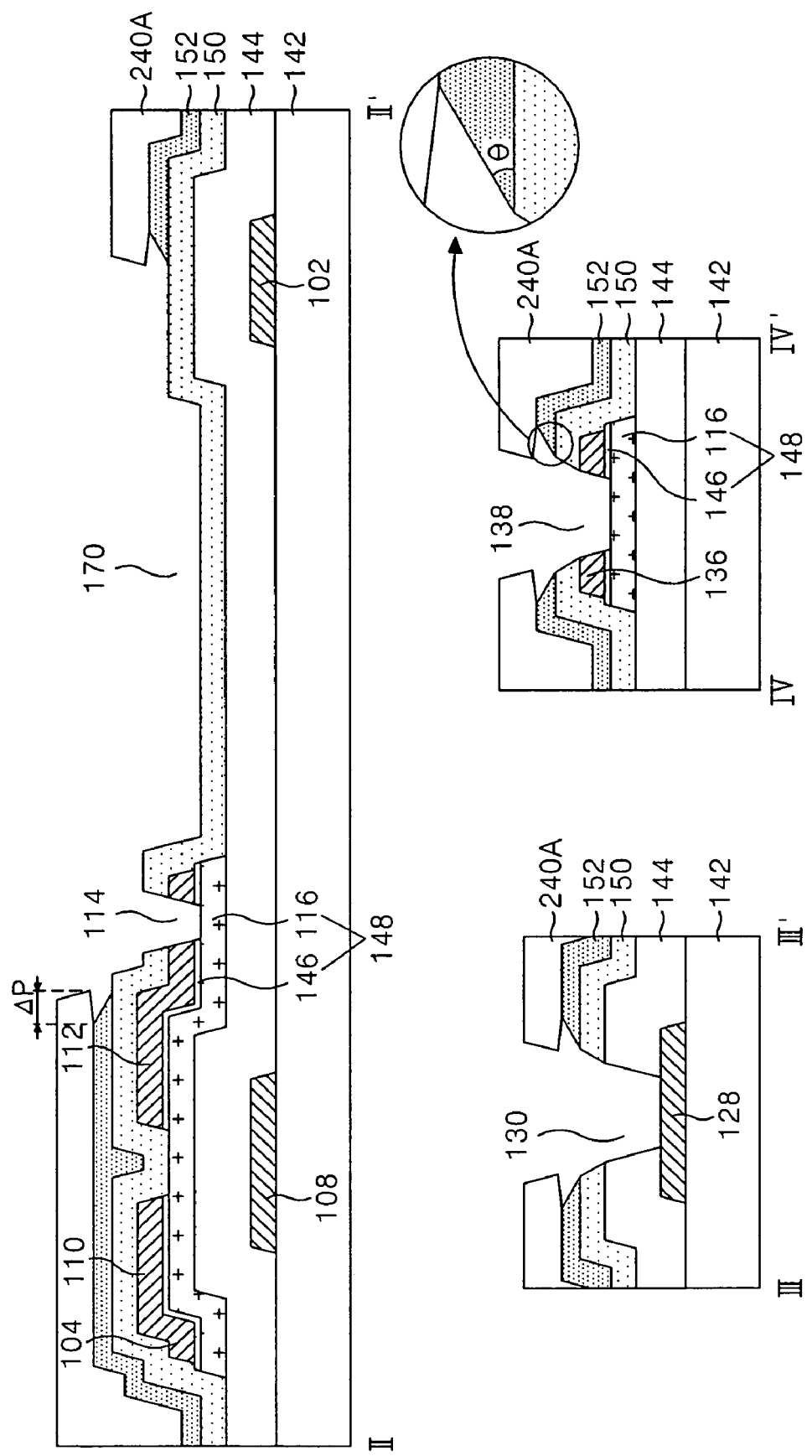

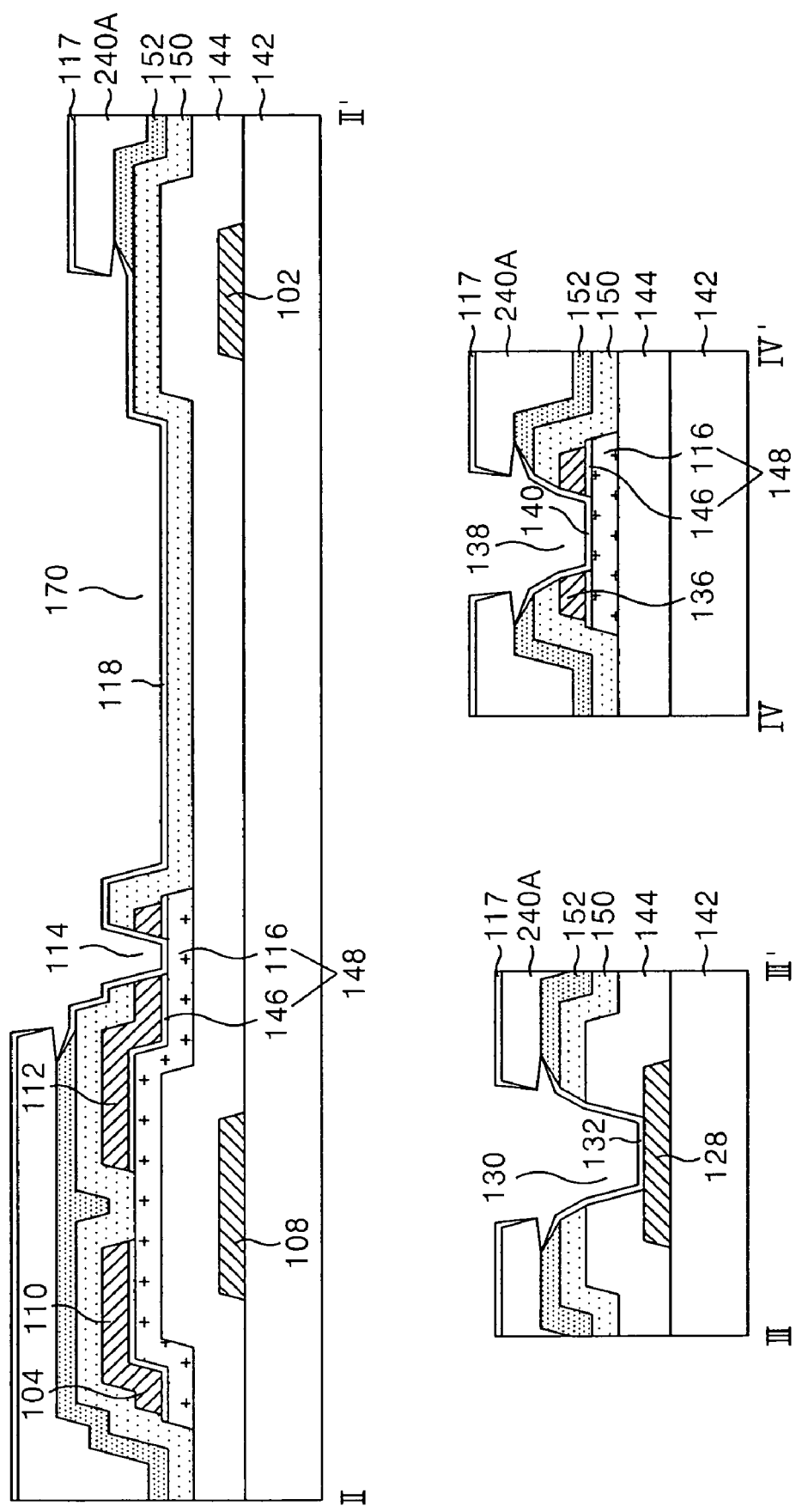

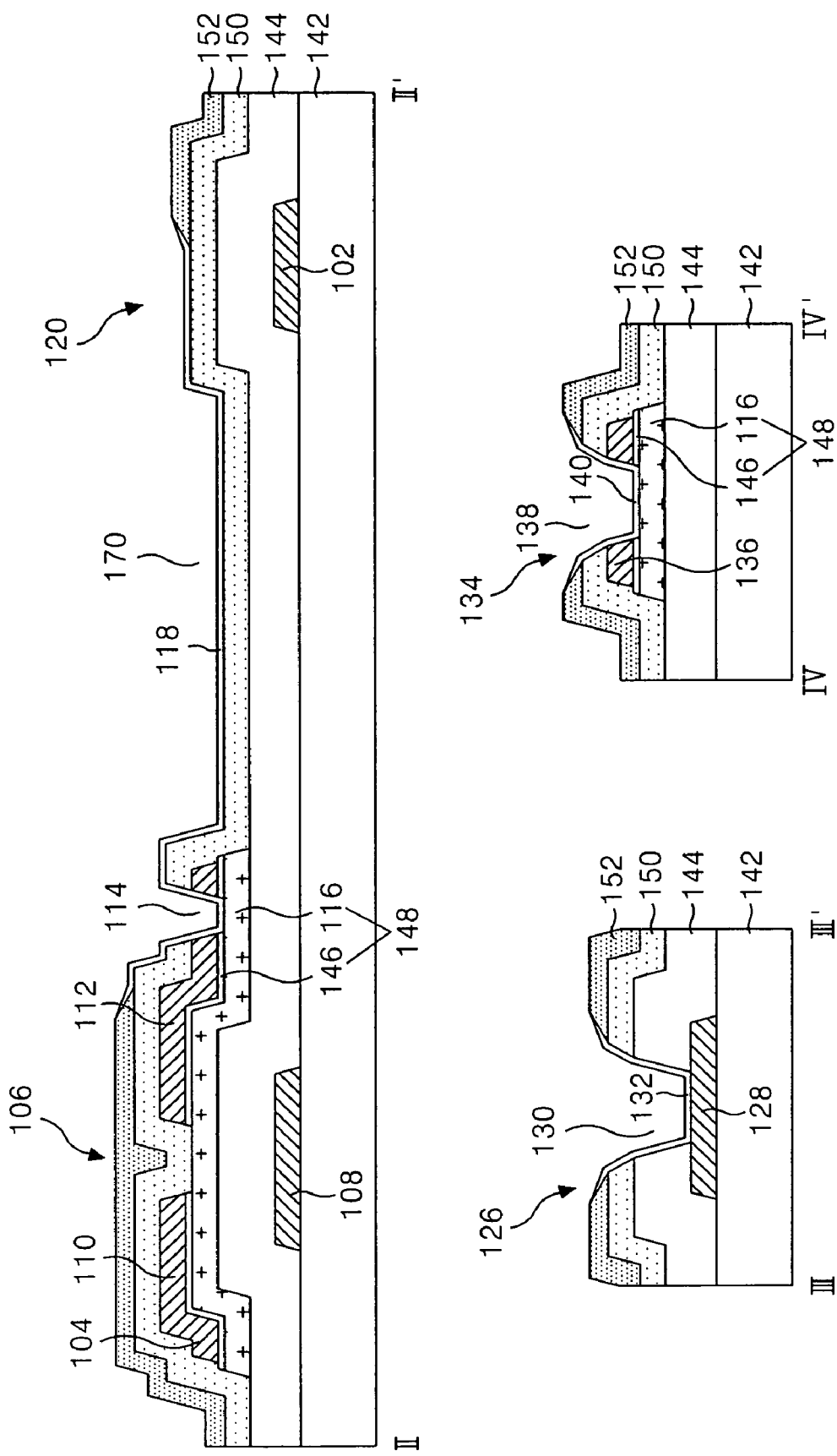

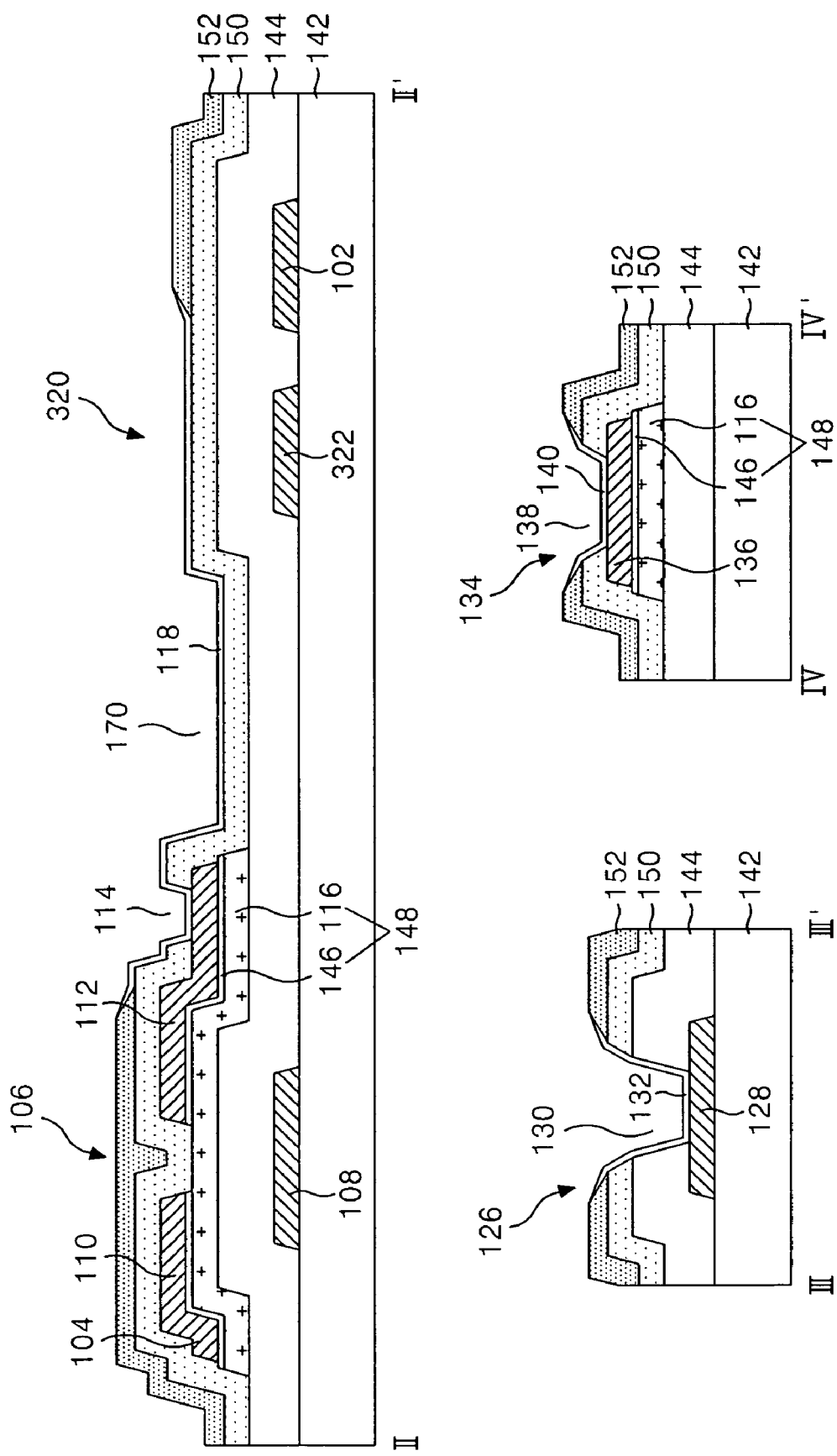

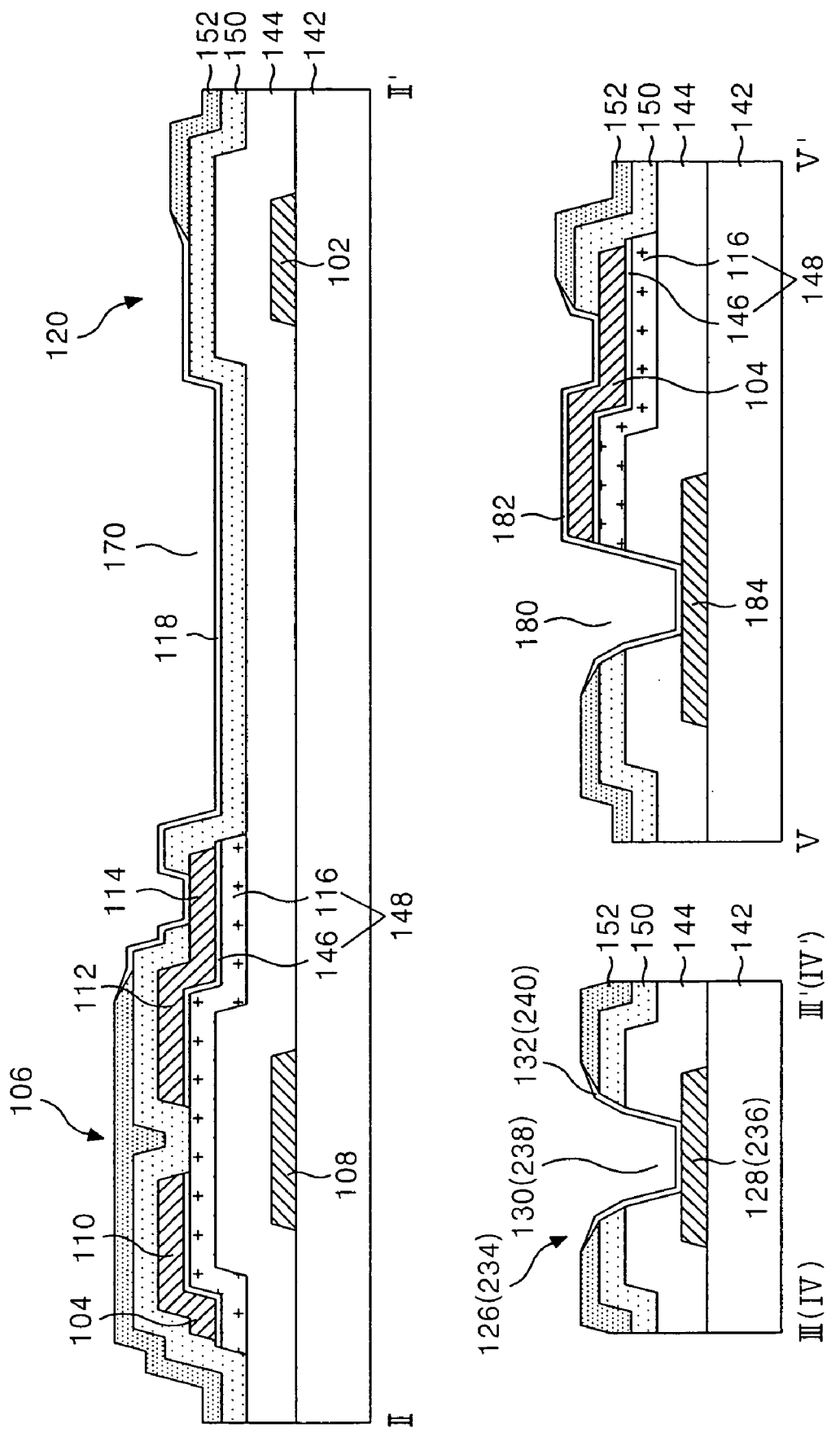

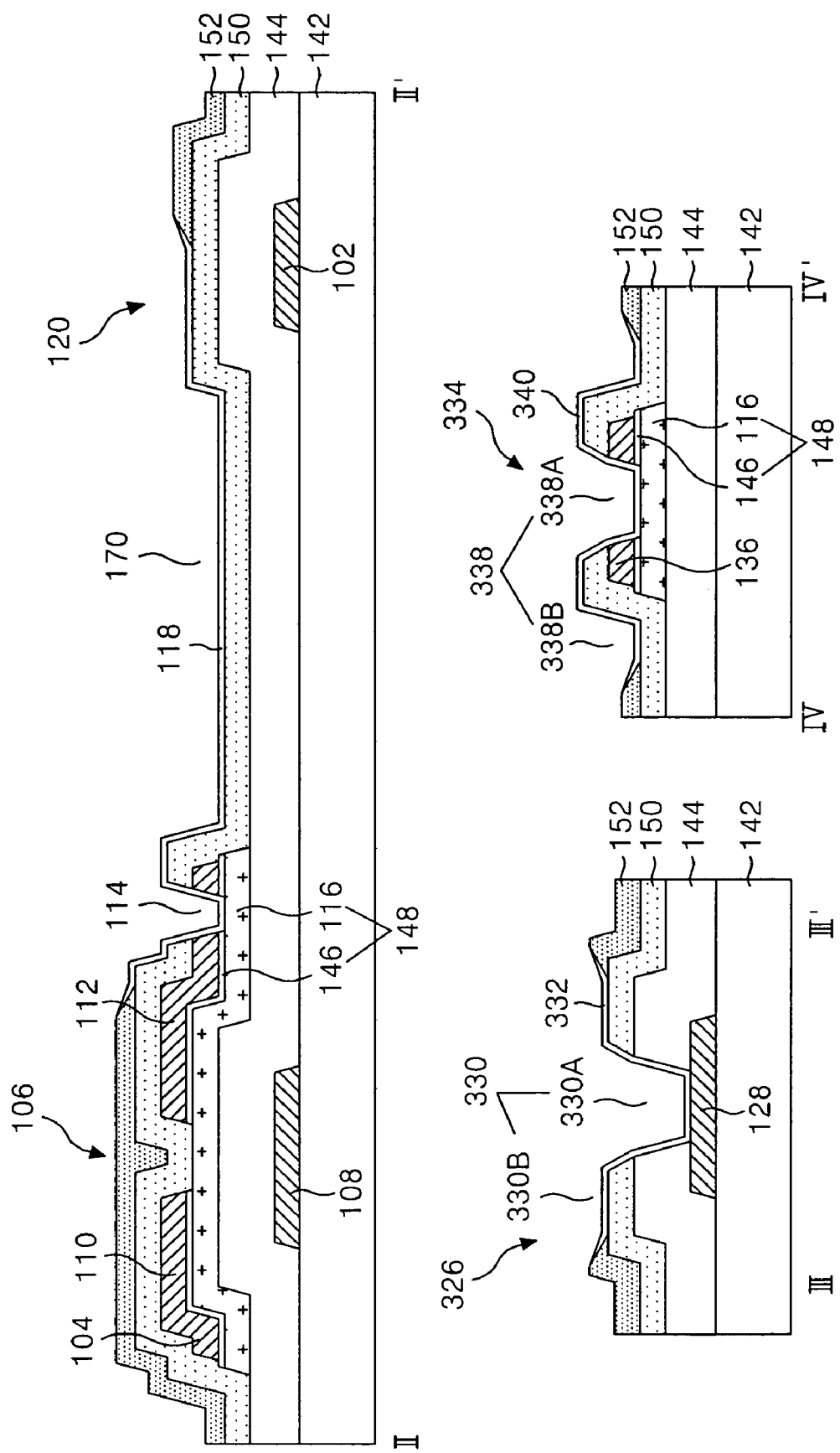

LIQUID CRYSTAL DISPLAY DEVICE AND METHOD FOR FABRICATING THE SAME

This application claims the benefit of Korean Patent Application No. 10-2004-0118566, filed on Dec. 31, 2004, which is hereby incorporated by reference for all purposes as if fully set forth herein.

BACKGROUND OF THE INVENTION

1. Field of the Invention

The present invention relates to a thin film transistor substrate applied to a display device and a fabricating method thereof, and more particularly to a thin film transistor substrate adapted to simplify processing, and a fabricating method thereof.

2. Description of the Related Art

A liquid crystal display device controls the light transmittance of liquid crystal having dielectric anisotropy by use of an electric field to display a picture. For this, the liquid crystal display device includes a liquid crystal display panel for displaying a picture through a liquid crystal cell matrix and a drive circuit for driving the liquid crystal display panel.

Referring to FIG. 1, a liquid crystal display panel of the related art includes a color filter substrate 10 and a thin film transistor substrate 20 which are bonded together with a liquid crystal 24 therebetween.

The color filter substrate 10 includes a black matrix 4, a color filter 6 and a common electrode 8 sequentially formed on an upper glass substrate 2. The black matrix 4 is formed in a matrix shape on the upper glass substrate 2. The black matrix 4 divides the area of the upper glass substrate 2 into a plurality of cell areas where a color filter 6 is formed. The black matrix 4 prevents light interference between adjacent cells and external light reflection. The color filter 6 is divided by the black matrix 4 into red R, green G and blue B filters in the cell area that transmit red, green and blue light. The common electrode 8 supplies a common voltage Vcom when driving liquid crystal 24, to a transparent conductive layer (not shown) formed over the entire surface of the color filter 6. An overcoat layer (not shown) is further formed between the color filter 6 and the common electrode 8 in order to planarize the color filter 6.

The thin film transistor substrate 20 includes a thin film transistor 18 and a pixel electrode 22, both formed at each cell area defined by the crossing of a gate line 14 and a data line 16 in a lower glass substrate 12. The thin film transistor 18 supplies a data signal from the data line 16 to the pixel electrode 22 in response to a gate signal from the gate line 14. The pixel electrode 22 is formed of a transparent conductive layer and supplies the data signal from the thin film transistor 18 to drive liquid crystal 24.

The liquid crystal 24 having dielectric anisotropy rotates according to an electric field formed by the data signal of the pixel electrode 22 and the common voltage Vcom of the common electrode 8 to control light transmittance. Thus, gray level may be realized.

The liquid crystal display panel further includes a spacer (not shown) for uniformly maintaining a cell gap between the color filter substrate 10 and the thin film transistor substrate 20.

The color filter substrate 10 and the thin film transistor substrate 20 of the liquid crystal display panel are formed by a plurality of mask processes. One mask process includes a plurality of processes such as a thin film deposition process, a cleaning process, a photolithography process (hereinafter, referred to as "photo-process"), an etching process, a photoresist peeling process, and an inspection process, etc.

The thin film transistor substrate 20 includes a semiconductor process and requires a plurality of mask processes. Thus, its fabricating process is complicated and is a large factor in the increase of manufacturing cost of the liquid crystal display panel. Accordingly, there is a need to reduce the number of mask processes in fabricating a thin film transistor substrate.

SUMMARY OF THE INVENTION

Accordingly, the present invention is directed to a liquid crystal display device and a method for fabricating the same that substantially obviates one or more of the problems due to limitations and disadvantages of the related art.

An advantage of the present invention is to provide a liquid crystal display device adapted to simplify processing, and a fabricating method thereof.

Additional features and advantages of the invention will be set forth in the description which follows, and in part will be apparent from the description, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the present invention, as embodied and broadly described, a liquid crystal display device includes a gate line on a substrate; a data line crossing the gate line with a gate insulating film to define a pixel area; a thin film transistor connected to the gate line and the data line; a semiconductor pattern overlapped along the data line; a double layer passivation film covering the data line and the thin film transistor, wherein layers of the passivation film have different etching rates; and a pixel electrode formed in a pixel hole penetrating an upper passivation film of the double layer passivation film and connected to a drain electrode of the thin film transistor exposed through a drain contact hole, the pixel electrode forming a border with the upper passivation film surrounding the pixel hole.

In another aspect of the present invention, a method of fabricating a liquid crystal display device includes a first mask process of forming a gate line on a substrate and a gate electrode connected to the gate line; a second mask process of forming a gate insulating film covering the gate line and the gate electrode, a semiconductor pattern on the gate insulating film, a data line crossing the gate line on the semiconductor pattern to define a pixel area, a source electrode connected to the data line, and a drain electrode facing the source electrode; a third mask process of forming a double layer passivation film covering the data line, the source electrode and the drain electrode, a pixel hole penetrating an upper passivation film of the double layer passivation film in the pixel area, a drain contact hole exposing the drain electrode, and a pixel electrode being formed in the pixel hole to be connected to the exposed drain electrode, the pixel electrode forming a border with a side surface of the upper passivation film surrounding the pixel hole.

In another aspect of the present invention, a method of fabricating a liquid crystal display device includes forming a gate line and a data line crossing each other with a gate insulating film on a substrate to define a pixel area, and a thin film transistor connected to the gate line and the data line; forming a double layer passivation film having a double structure on the substrate, wherein layers of the passivation film have different etching rates; forming a photo-resist pattern on the double layer passivation film; forming a pixel hole penetrating an upper passivation film of the double layer passivation film and a contact hole penetrating the double layer passivation film by wet-etching using the photo-resist pattern as a mask; forming a transparent conductive film on the photo-resist pattern, and a pixel electrode in the pixel hole to form a border with the upper passivation film, the pixel electrode being connected to the thin film transistor through the contact hole; and lifting-off the photo-resist pattern over the transparent conductive film.

In another aspect of the present invention, a method of fabricating a liquid crystal display device includes forming a first conductive layer on a substrate; forming a lower insulating film covering the first conductive layer; forming an upper insulating film having a higher etching rate than the lower insulating film; forming a photo-resist pattern on the upper insulating film; forming a first hole penetrating the upper and lower insulating films; forming a second hole to expose the lower insulating film by wet-etching the upper insulating film, and forming a side surface of the upper insulating film over-etched than the photo-resist pattern; forming a second conductive layer covering the photo-resist pattern, and a second conductive pattern, which is separated from the second conductive layer and connected to the first conductive layer through the first hole, in the second hole to form a border with the upper insulating film; and lifting off the photo-resist pattern over the second conductive layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 3A and 3B are sectional diagrams illustrating the thin film transistor substrate shown in FIG. 2, taken along the lines II-II', III-III', IV-IV';

FIGS. 6A to 6E are sectional diagrams illustrating the second mask process of the present invention;

FIGS. 8A to 8F are sectional diagrams for illustrating the third mask process of the present invention;

FIGS. 11A and 11B are sectional diagrams illustrating the thin film transistor substrate shown in FIG. 10, taken along the lines II-II', III-III', IV-IV';

FIGS. 13A and 13B are sectional diagrams illustrating the thin film transistor substrate shown in FIG. 12, taken along the lines II-II', III-III', IV-IV', V-V';

FIGS. 15A and 15B are sectional diagrams illustrating the thin film transistor substrate shown in FIG. 14, taken along the lines II-II', III-III', IV-IV';

DETAILED DESCRIPTION OF THE ILLUSTRATED EMBODIMENTS

Reference will now be made in detail to embodiments of the present invention, examples of which are illustrated in the accompanying drawings. Wherever possible, like reference designations will be used throughout the drawings to refer to the same or similar parts.

Figure 1:
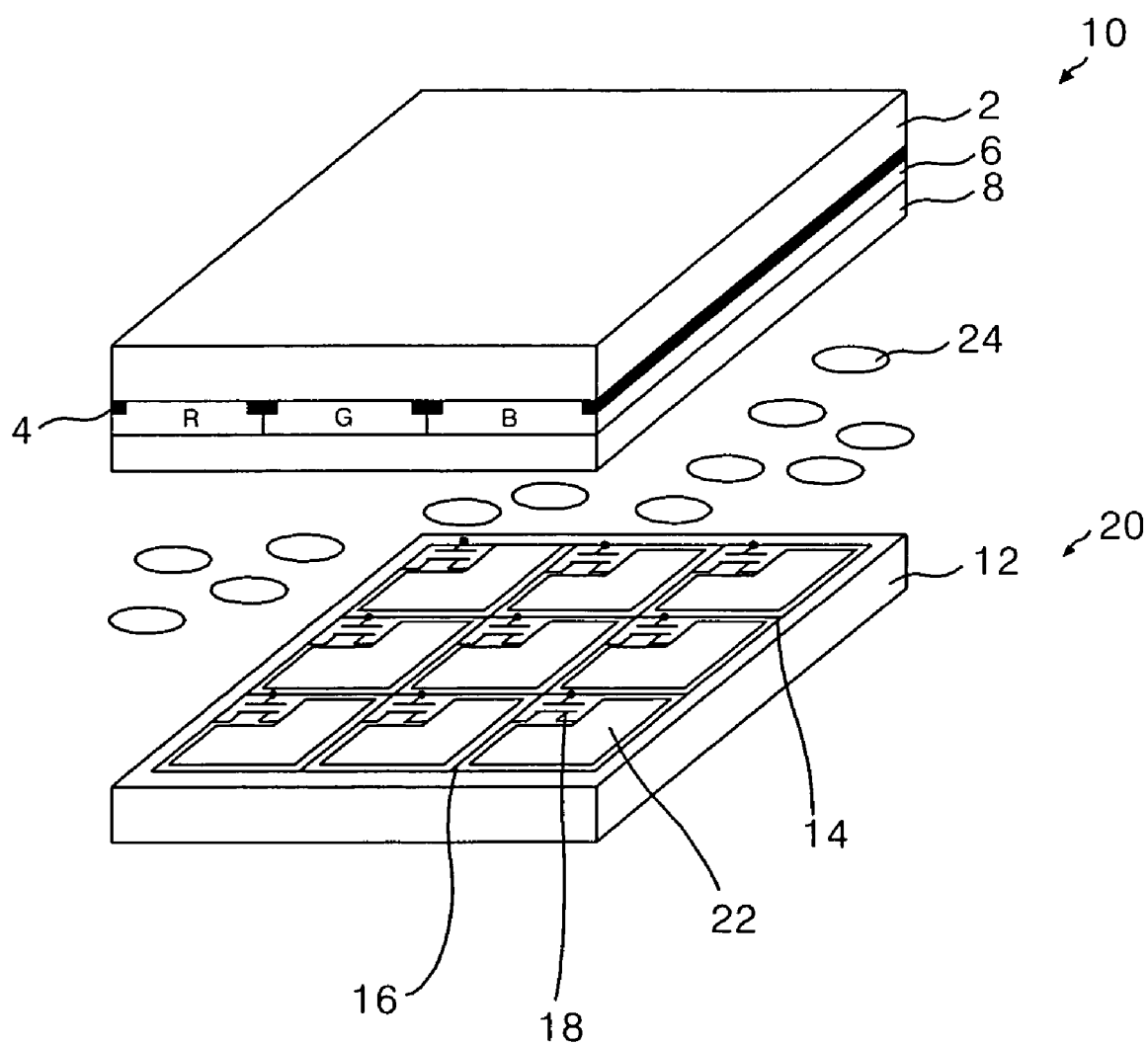
FIG. 1 is a perspective view illustrating a liquid crystal display panel of the related art.
Figure 2:
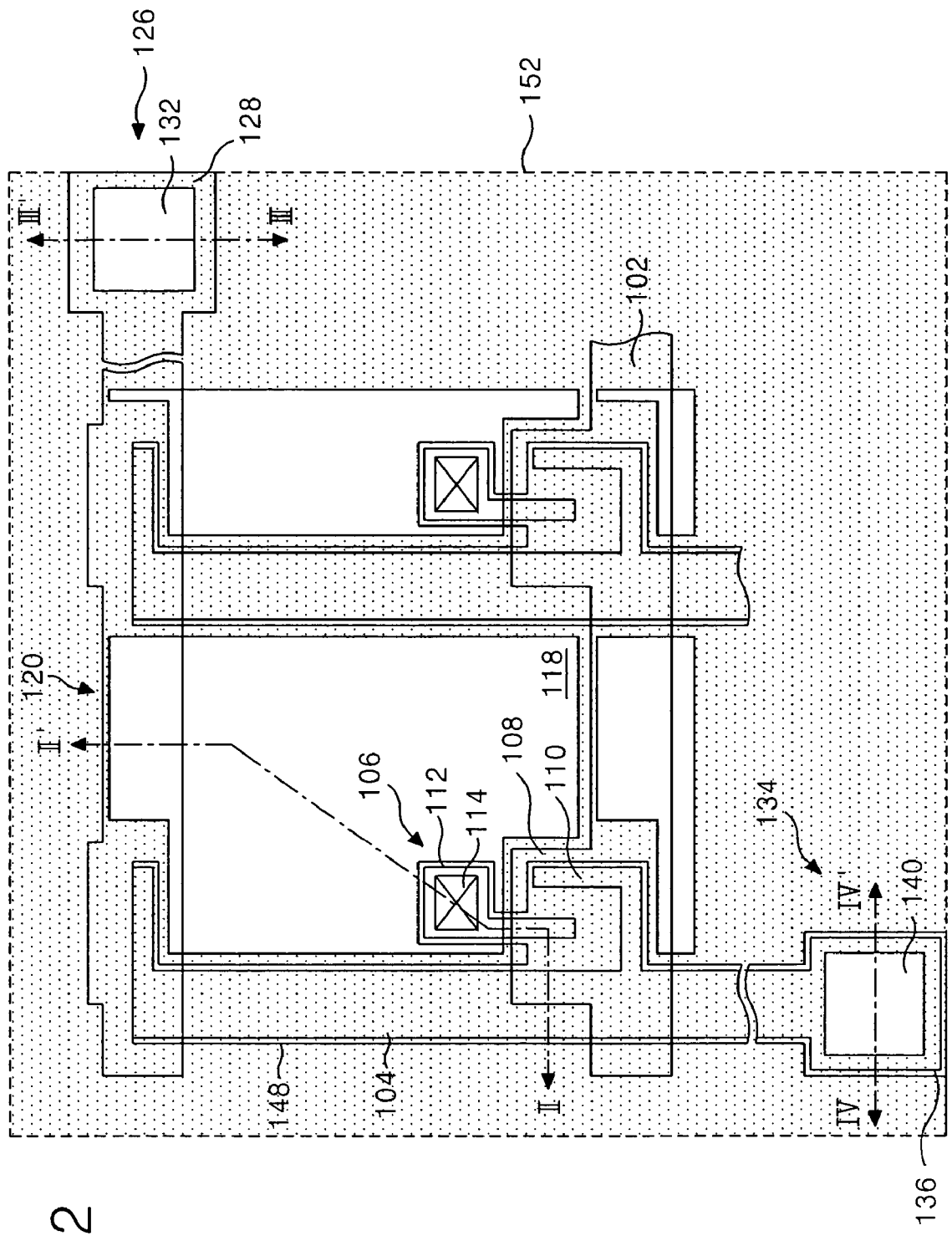
FIG. 2 is a plan view illustrating part of a thin film transistor substrate according to an embodiment of the present invention.

Referring to FIGS. 2, 3A and 3B, the thin film transistor substrate shown includes a gate line 102 and a data line 104 formed on a lower substrate 142 to cross each other, wherein a gate insulating film 144 is formed therebetween; a thin film transistor 106 adjacent to the crossing; and a pixel electrode 118 formed in a pixel area defined by the crossing. The thin film transistor substrate further includes a gate pad 126 connected to the gate line 102; a data pad 134 connected to the data line 104; and a storage capacitor formed by overlapping the pixel electrode 118 and the gate line 102.

The thin film transistor 106 supplies a pixel signal to the data line 104, which is charged and kept in the pixel electrode 118 in response to a scan signal supplied to the gate line 102. For this, the thin film transistor 106 includes a gate electrode 108 connected to the gate line 102; a source electrode 110 connected to the data line 104; a drain electrode 112 facing the source electrode and connected to the pixel electrode 118; an active layer 116 overlapping the gate electrode 108, wherein a gate insulating film 144 is formed therebetween; and an ohmic contact layer 146 formed on the active layer 116 except in a channel. The ohmic contact layer 146 is in ohmic contact with the source electrode 110 and the drain electrode 112. Furthermore, the active layer 116 overlapping the gate electrode 108 forms a channel between the source electrode 110 and the drain electrode 112. A semiconductor pattern 148 including the active layer 116 and the ohmic contact layer 146 is formed to overlap the data line 104.

A passivation film covering the thin film transistor 106 and the data line 104 can be formed in a multiple layered structure, i.e., a double or multiple layered structure. Hereinafter a double layered structure including first passivation film 150 and second passivation film 152 will be taken as an example for explanation.

A pixel hole 170 which penetrates the second passivation film 152 is formed in a pixel area defined by a crossing of the gate line 102 and the data line 104. Further, a drain contact hole 114 is formed in the pixel area, i.e., inside the pixel hole 170, as shown in FIG. 3A, wherein the drain contact hole 114 penetrates the ohmic contact layer 146 under the drain electrode 112 or the drain electrode 112 to expose a side surface of the drain electrode 112. Alternatively, as shown in FIG. 3B, the drain contact hole 114 is formed to penetrate the first passivation film 150 so as to expose a surface of the drain electrode 112. Accordingly, the pixel electrode 118 is formed on the first passivation film 150 inside the pixel hole 170 and is connected to a side surface or a surface of the drain electrode 112 that is exposed through the drain contact hole 114. The pixel electrode 118 is charged with the pixel signal supplied from the thin film transistor 106 and generates a potential difference with a common electrode formed in a color filter substrate (not shown). The potential difference causes a liquid crystal, located between the thin film transistor substrate and the color filter substrate, to rotate by dielectric anisotropy, thereby controlling the amount of light incident from a light source (not shown) through the pixel electrode 118 to the color filter substrate.

The storage capacitor 120 is formed in a storage-on-gate structure by overlapping the gate line 102 with the pixel electrode 118, wherein the gate insulating film 144 and the first passivation film 150 is formed therebetween. The storage capacitor 120 charges and stably maintains the pixel signal in the pixel electrode 118.

The gate line 102 is connected to a gate driver (not shown) through a gate pad 126. The gate pad 126 includes a gate pad lower electrode 128 extending from the gate line 102 and a gate pad upper electrode 132 which is formed within a first contact hole 130 that penetrates the first and second passivation films 150, 152 and the gate insulating film 144. Gate pad upper electrode 132 is connected to the gate pad lower electrode 128.

The data line 104 is connected to a data driver (not shown) through a data pad 134. The data pad 134 includes a data pad lower electrode 136 extended from the data line 104 and the semiconductor pattern 148 thereunder, and a data pad upper electrode 140 which is formed within a second contact hole 138 that exposes the data pad lower electrode 136. The data pad upper electrode 140 is connected to the data pad lower electrode 136. Herein, the second contact hole 138, as shown in FIG. 3A, is formed to penetrate the second passivation film 152 to the ohmic contact layer 146 or to the data pad lower electrode 136 to expose a side surface of the data pad lower electrode 136. Alternatively, as shown in FIG. 3B, the second contact hole 138 is formed to penetrate the first and second passivation films 150, 152 to expose a surface of the data pad lower electrode 136.

In such a thin film transistor substrate, a transparent conductive pattern having the pixel electrode 118, the gate pad upper electrode 132 and the data pad upper electrode 140 borders with a side surface of the second passivation film 152 inside a corresponding hole. The second passivation film 152 is formed of an insulating material having a higher etching rate than that of the first passivation film 150. A side surface of the second passivation film 152 covering the corresponding hole has a gentle tilt angle compared to a side surface of the first passivation film 150, i.e., it has a tilt angle of below 45 degrees (for example, 15°-45°).

For example, in a case using SiNx, the first and second passivation films 150, 152 have different nitrogen contents. Specifically, the first passivation film 150 is formed of silicon-rich SiNx and the second passivation film 152 is formed of nitrogen-rich SiNx. Accordingly, the second passivation film 152 has a higher etching rate than the first passivation film 150, thus the side surface of the second passivation film 152 can have a gentler tilt angle than the side surface of the first passivation film 150.

Alternatively, the first passivation film 150 is formed of SiNx and the second passivation film 152 is formed of SiOx so that the etching rate of the second passivation film 152 is higher than that of the first passivation film 150.

As a result, the transparent conductive pattern is deposited as far as the side surface of the second passivation film 152 having the gentle tilt angle allows. Thus, it is possible to prevent exposing the metal layer under the transparent conductive pattern. Further, the pixel electrode 118 is formed on the first passivation film 150 to reduce a step difference. Thus, it is possible to prevent a rubbing defect caused by the step difference of the pixel electrode 118.

The thin film transistor substrate according to the first embodiment of the present invention is formed by the following three mask processes.

Figure 4A:
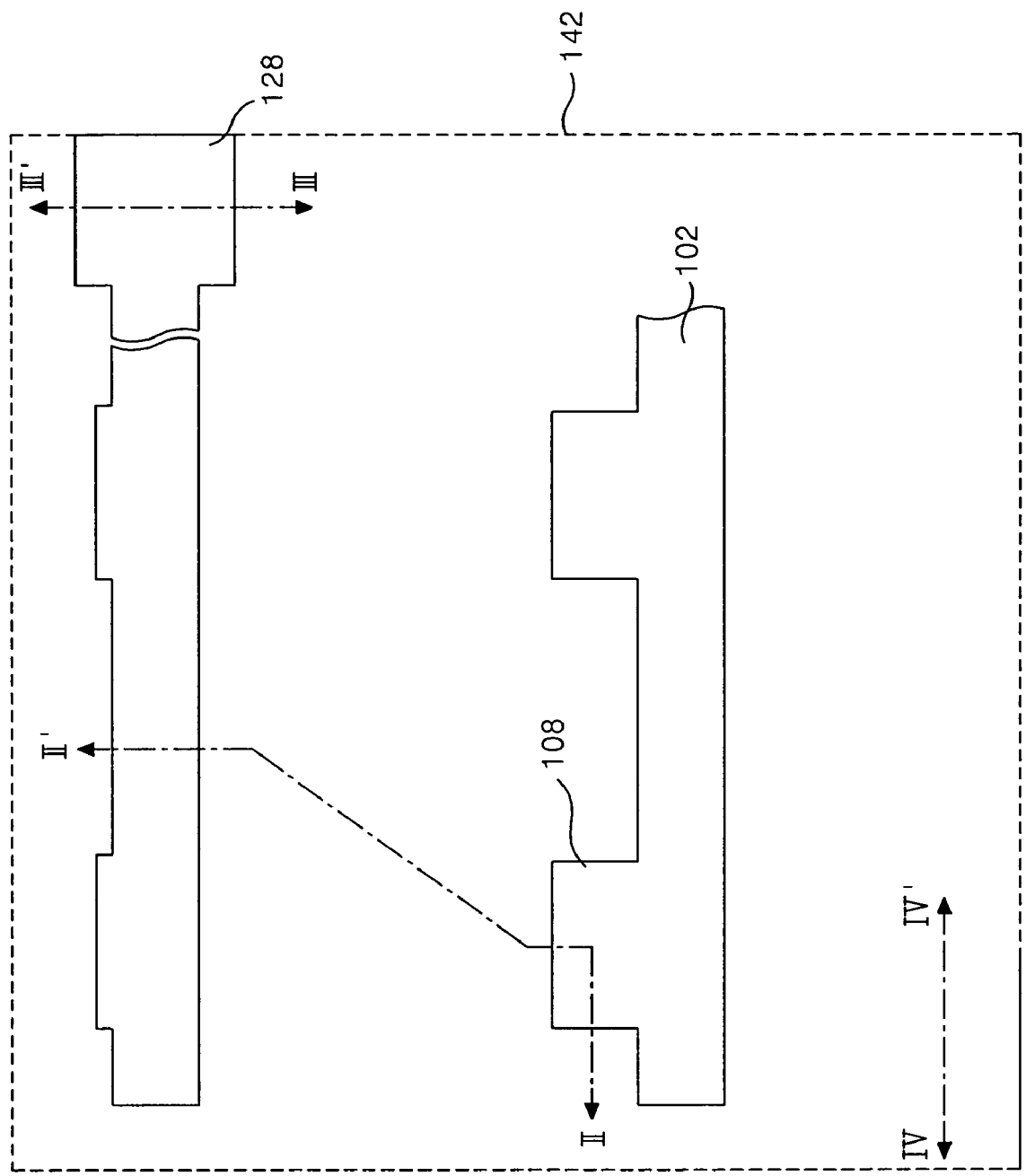
FIGS. 4A and 4B are a plan view and a sectional diagram illustrating a first mask process of the thin film transistor according to the embodiment of the present invention.
Figure 4B:
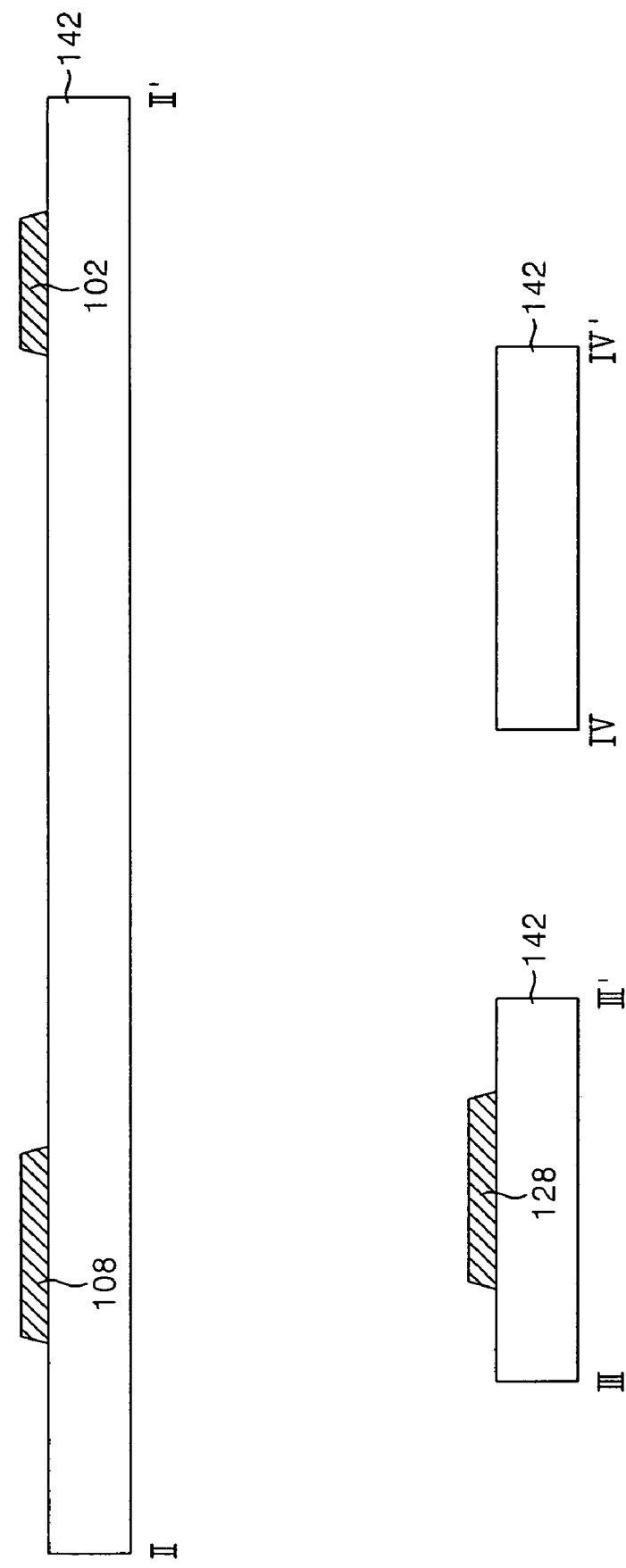

FIGS. 4A and 4B are a plan view and a sectional diagram illustrating a first mask process in a fabricating method of a thin film transistor according to an embodiment of the present invention.

Referring to FIGS. 4A and 4B, a gate metal pattern having a gate line 102, a gate electrode 108 connected to a gate line 102, and a gate pad lower electrode 128 is formed on the lower substrate by the first mask process.

Specifically, a gate metal layer is formed on the lower substrate 142 by a deposition method such as sputtering. The gate metal layer is formed of Mo, Ti, Cu, AlNd, Al, Cr, Mo alloy, Cu alloy and Al alloy in a single layer, or is formed in a multi-layered structure like Al/Cr, Al/Mo, Al(Nd)/Al, Al(Nd)/Cr, Mo/Al(Nd)/Mo, Cu/Mo, Ti/Al(Nd)/Ti, Mo/Al, Mo/Ti/Al(Nd), Cu alloy/Mo, Cu alloy/Al, Cu alloy/Mo alloy, Cu alloy/Al alloy, Al/Mo alloy, Mo alloy/Al, Al alloy/Mo alloy, Mo alloy/Al alloy and Mo/Al alloy. Subsequently, the gate metal layer is patterned by a photolithography process and an etching process using a first mask, thereby forming the gate metal pattern having the gate line 102, the gate electrode 108 and the gate pad lower electrode 128.

Figure 5A:
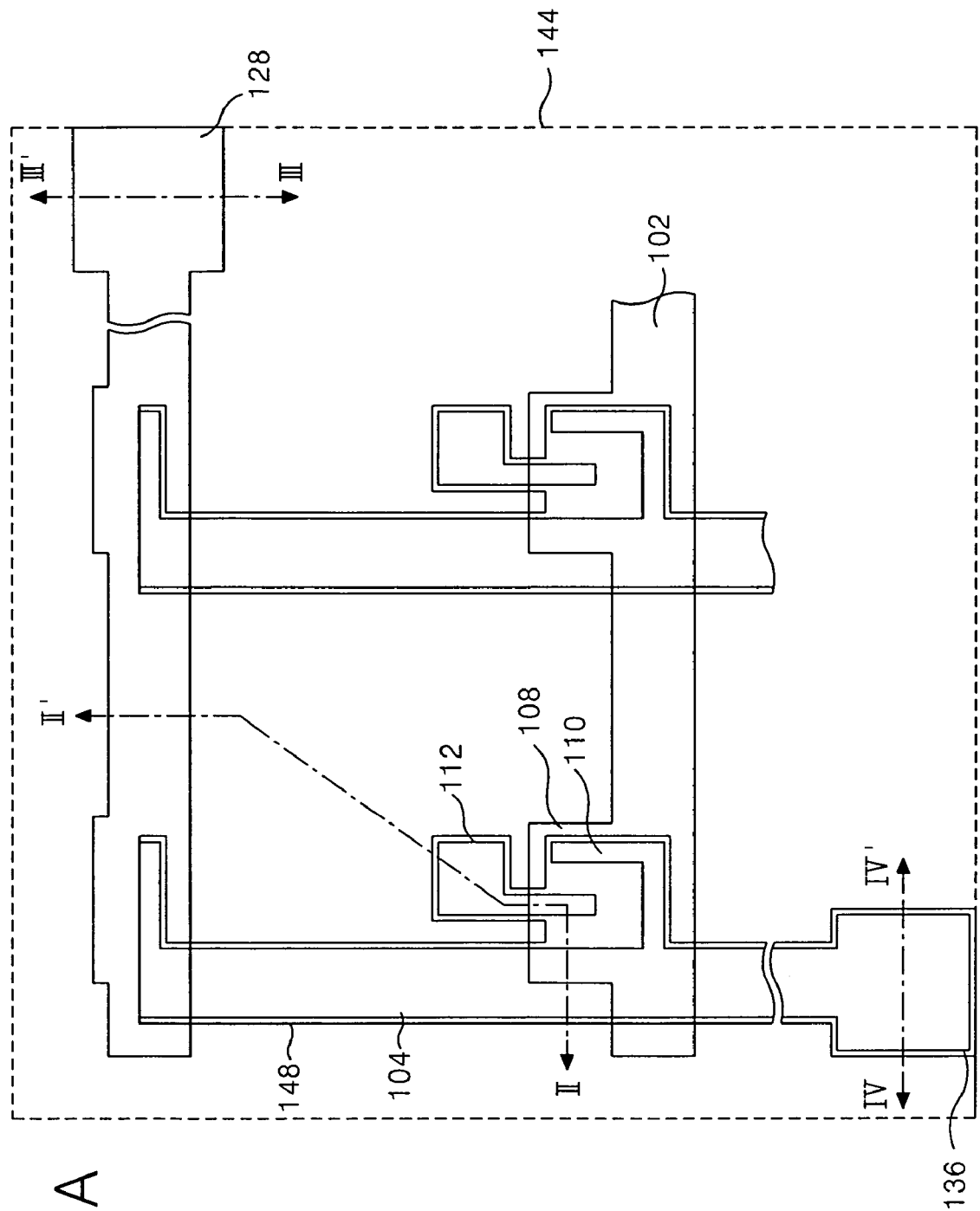
FIGS. 5A and 5B are a plan view and a sectional diagram illustrating a second mask process of the thin film transistor according to the embodiment of the present invention.
Figure 5B:
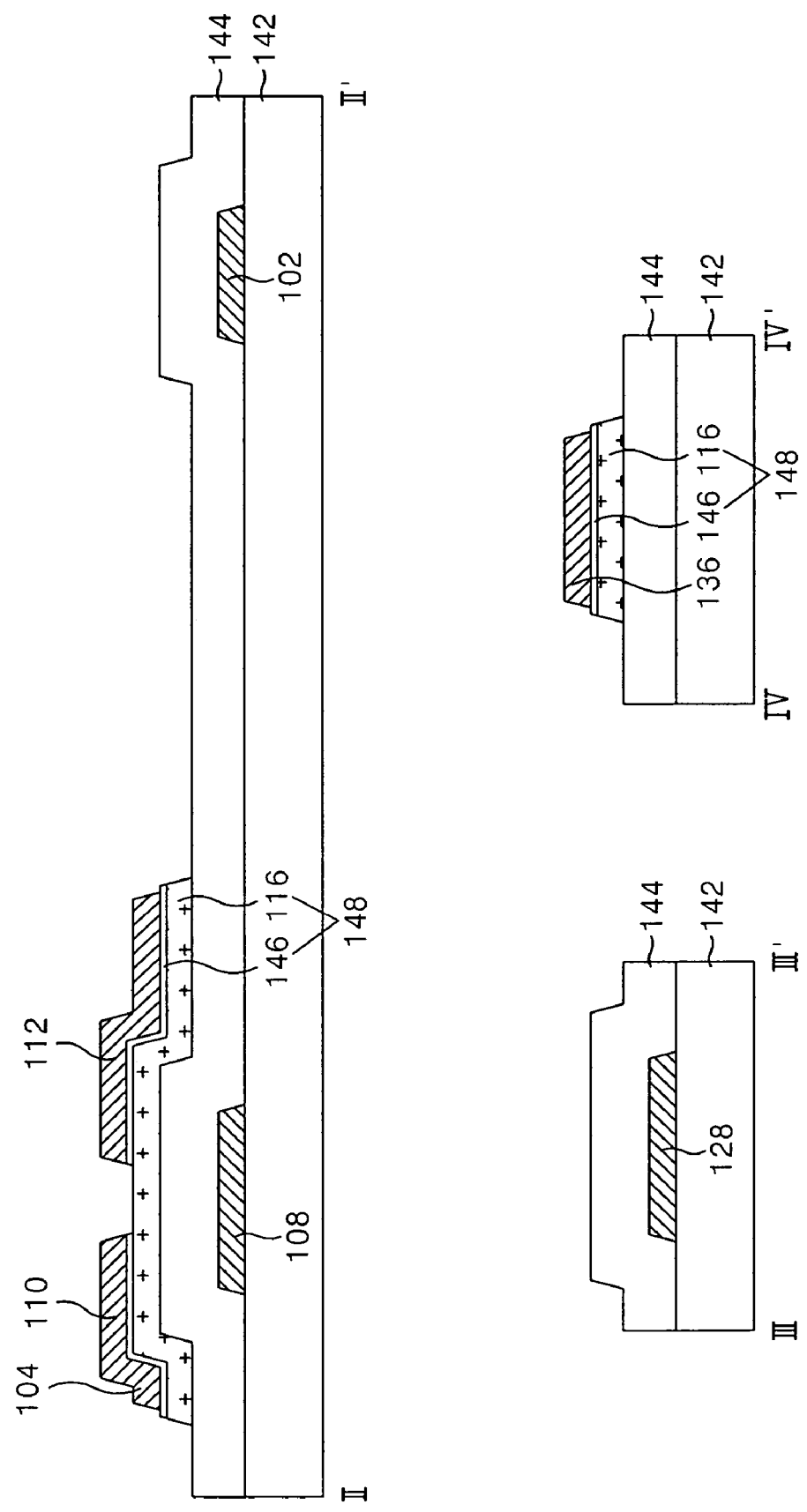

FIGS. 5A and 5B are a plan view and a sectional diagram illustrating a second mask process in the fabricating method of the thin film transistor according to an embodiment of the present invention. FIGS. 6A and 6E are sectional diagrams also illustrating the second mask process.

Referring to FIGS. 5A and 5B, the gate insulating film 144 is formed on the lower substrate 142 where the gate metal pattern is formed. Then, a source/drain metal pattern having a data line 104, a source electrode 110, a drain electrode 112 and a data pad lower electrode 136 are formed. Also, a semiconductor pattern 148 having an active layer 116 and an ohmic contact layer 146 that overlap along and under the source/drain metal pattern is formed. The semiconductor pattern 148 and the source/drain pattern are formed by one mask process using a diffractive exposure mask or a halftone mask. Hereinafter, using the diffractive exposure mask is only taken as an example for explanation.

Referring to FIG. 6A, the gate insulating film 144, an amorphous silicon layer 115, an amorphous silicon layer 145 doped with impurities (n+ or p+), and a source/drain metal layer 105 are sequentially formed on the lower substrate 142 where the gate pattern is formed. For example, the gate insulating film 144, the amorphous silicon layer 115, and the amorphous silicon layer 145 doped with the impurities are formed by a PECVD method, and the source/drain metal layer 105 is formed by a sputtering method. The gate insulating film 144 is formed of an inorganic insulating material such as silicon oxide SiOx or silicon nitride SiNx. The source/drain metal layer 105 is formed of a metal material such as Mo, Ti, Cu, AlNd, Al, Cr, Mo alloy, Cu alloy and Al alloy in a single layer, or is formed in a multi-layered structure like Al/Cr, Al/Mo, Al(Nd)/Al, Al(Nd)/Cr, Mo/Al(Nd)/Mo, Cu/Mo, Ti/Al(Nd)/Ti, Mo/Al, Mo/Ti/Al(Nd), Cu alloy/Mo, Cu alloy/Al, Cu alloy/Mo alloy, Cu alloy/Al alloy, Al/Mo alloy, Mo alloy/Al, Al alloy/Mo alloy, Mo alloy/Al alloy and Mo/Al alloy. After a photo-resist 219 is formed over the source/drain metal layer 105, the photo-resist 219 is exposed and developed by the photolithography process using a diffractive exposure mask 210, thereby forming a photo-resist pattern 220 with a step difference, as shown in FIG. 6B.

As shown in FIG. 6A, the diffractive exposure mask 210 includes a transparent quartz substrate 212, and a shielding layer 214 and a diffractive exposure slit 216, wherein the shielding layer 214 and diffractive exposure slit 216 are formed of a metal layer such as Cr and CrOx. The shielding layer 214 is located in an area where the semiconductor pattern and the source/drain pattern are to be formed. The shielding layer 214 shields ultraviolet rays, thereby allowing a first photo-resist pattern 220A to remain after development, as shown in FIG. 6B. The diffractive exposure slit 216 is located in an area where the channel of the thin film transistor is to be formed. The diffractive exposure slit 216 diffracts the ultraviolet ray, thereby leaving a second photo-resist pattern 220B which is thinner than the first photo-resist pattern 220A after development as shown in FIG. 6B. A transmission part of the diffractive exposure mask 210 where only the quartz substrate 212 exists transmits all the ultraviolet rays, thereby removing part of the photo-resist after development, as shown in FIG. 6B.

Referring to FIG. 6C, the source/drain metal layer 105 is patterned by the etching process using the photo-resist pattern 220 with the step difference, thereby forming the source/drain metal pattern and the semiconductor pattern 148 thereunder. In this case, the source electrode 110 and the drain electrode 112 in the source/drain metal pattern have an integrated structure.

Referring to FIG. 6D, the photo-resist pattern 220 is ashed by an ashing process using oxygen plasma $O_2$ to make the first photo-resist pattern 220A thin and remove the second photo-resist pattern 220B. Subsequently, the source/drain metal pattern exposed by the elimination of the second photo-resist pattern 220B and the ohmic contact layer 146 thereunder are removed by the etching process using the ashed first photo-resist pattern 220A, thereby separating the source electrode 110 from the drain electrode 112 and exposing the active layer 116. At this moment, both side parts of the source/drain metal pattern are once more etched along the ashed first photo-resist pattern 220A, thereby allowing the source/drain metal pattern and the semiconductor pattern 148 to have a fixed step difference in a step shape.

The first photo-resist pattern 220A remaining on the source/drain metal pattern is removed by a stripping process, as shown in FIG. 6E.

Figure 7A:
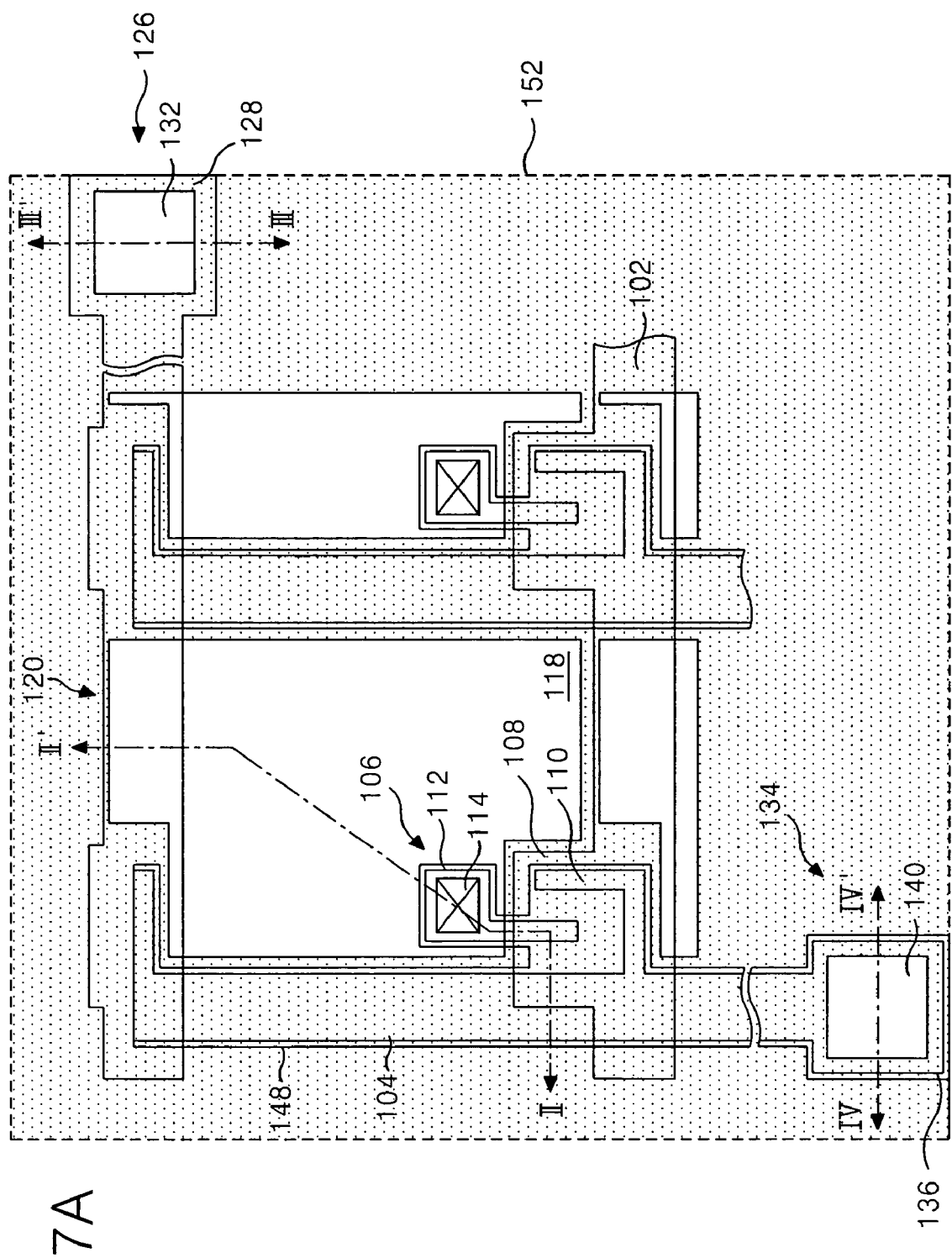
FIGS. 7A and 7B are a plan view and a sectional diagram illustrating a third mask process of the thin film transistor according to the embodiment of the present invention.
Figure 7B:
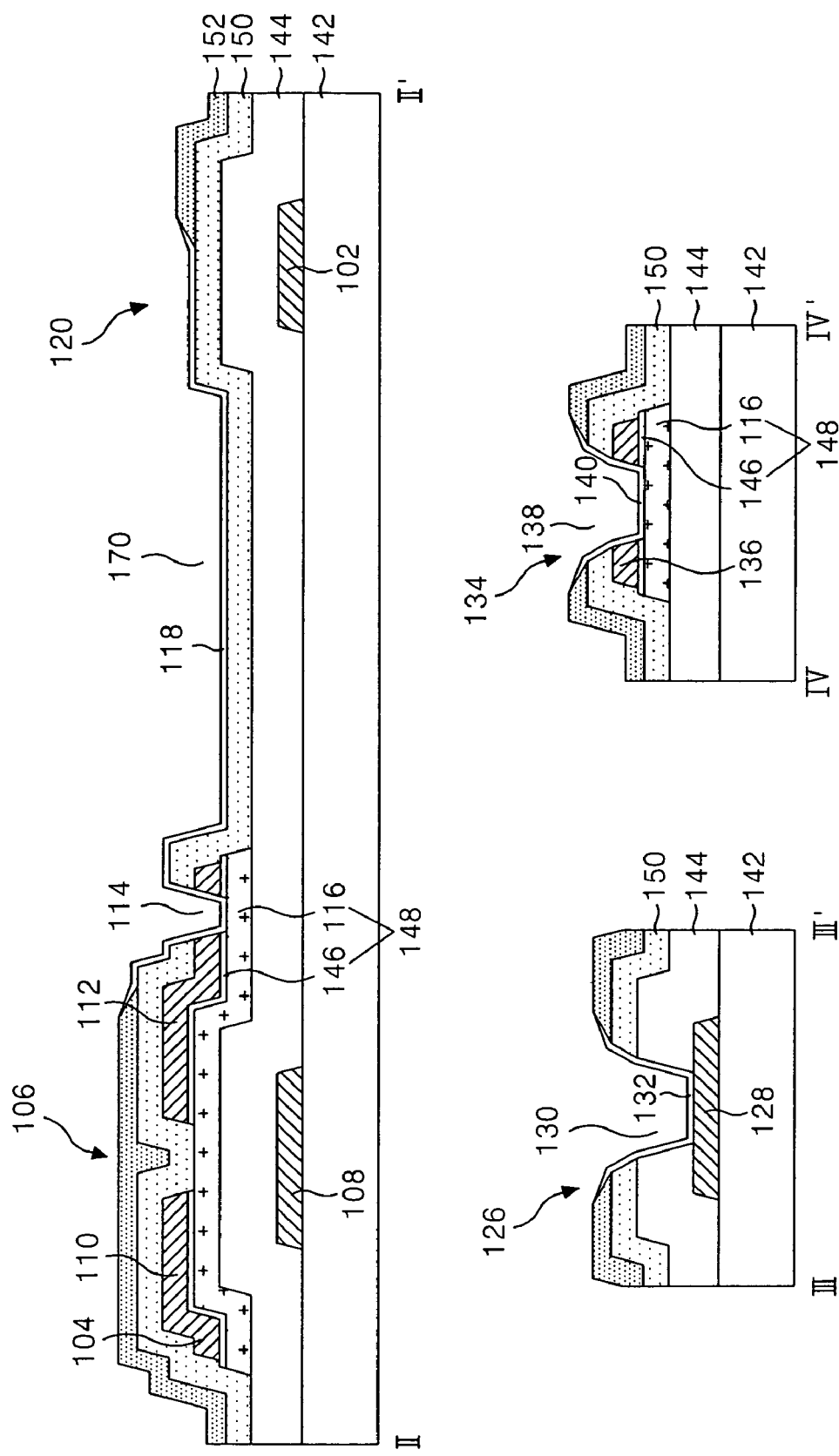

FIGS. 7A and 7B are a plan view and a sectional diagram illustrating a third mask process in the fabricating method of the thin film transistor substrate according to the present invention. FIGS. 8A to 8F are sectional diagrams also illustrating the third mask process.

Referring to FIGS. 7A and 7B, by the third mask process, the first passivation film 150 and second passivation film 152 having the pixel hole 170 and a plurality of contact holes 114, 130, 138 are formed. The transparent conductive pattern having the pixel electrode 118, the gate pad upper electrode 132 and the data pad upper electrode 140 are also formed. Herein, the pixel hole 170 is formed to penetrate only the second passivation film 152, the first contact hole 130 is formed to penetrate as far as the gate insulating film 144, and the drain contact hole 114 and the second contact hole 138 are formed to penetrate as far as the ohmic contact layer 146 or the first and second passivation film 150, 152. In this way, the pixel hole 170, the drain contact hole 114 and the first and second contact holes 130, 138 which have different depths are formed by use of the diffractive exposure mask or the halftone mask. Hereinafter, using the halftone mask will be taken as an example for explanation.

Referring to FIG. 8A, the first and second passivation films 150, 152 are formed by a method such as PECVD, spin coating or spinless coating on the gate insulating film 144 where the source/drain metal pattern is formed. The first and second passivation films 150, 152 are formed of an inorganic insulating material like the gate insulating film 144. Alternatively, the first and second passivation films 150, 152 might be formed of an organic insulating material such as an acrylic organic compound, BCB or PFCB. The second passivation film 152 of the upper layer may be formed of an insulating material which has a higher etching rate than the first passivation film 150.

For example, when using SiNx for the first and second passivation films 150, 152, the "N" content of each of the first and second passivation films 150, 152 are made to be different. In other words, the first passivation film 150 is formed of Si-rich (silicon rich). SiNx and the second passivation film 152 is formed of N-rich (nitrogen rich) SiNx. Alternatively, the first passivation film 150 may be formed of SiOx, and the second passivation film 152 may be formed of SiNx.

Subsequently, after a photo-resist 239 is formed over the second passivation film 152, exposure and development are performed by a photolithography process using the halftone mask 230, thereby forming a photo-resist pattern 240 with a step difference, as shown in FIG. 8B.

Specifically, the halftone mask 230 includes a transparent quartz substrate 232, a partial transmission layer 236 and a shielding layer 234 formed thereon. The shielding layer 234 is formed of a metal such as Cr or CrOx, and the partial transmission layer 236 is formed of MoSix. Herein, the shielding layer 234 overlapped with the partial transmission layer 236 is located in an area, where the first and second passivation films 150, 152 are to exist. The shielding layer 234 intercepts the ultraviolet rays UV, thereby leaving the first photo-resist pattern 240A after development, as shown in FIG. 8B. The partial transmission layer 236 is located in an area where the pixel hole penetrating the second passivation film 152 is to be formed. The partial transmission layer 236 partially transmits the ultraviolet rays UV, thereby leaving the second photo-resist pattern 240B which is thinner than the first photo-resist pattern 240A after development, as shown in FIG. 8B. Only the quartz substrate 232 is located in an area where the drain contact hole 114 and the second contact hole 138 penetrating the second passivation film 152 as far as the ohmic contact layer 146 and where the first contact hole 130 penetrating part of the gate insulating film 144 are to be formed. The quartz substrate 232 transmits all the ultraviolet rays UV, thereby removing the photo-resist 239, as shown in FIG. 8B.

Referring to FIG. 8C, the first and second passivation films 150, 152 and the gate insulating film 144 are etched by an etching process, e.g., a dry etching process, using the photo-resist pattern 240 with the step difference as a mask to form the drain contact hole 114, and the first and second contact holes 130, 138. The drain contact hole 114 penetrates the second passivation film 152 as far as the drain electrode 112 or the ohmic contact layer 146 to expose the side surface of the drain electrode 112. Also the first contact hole 130 may be formed to have the second passivation film 152 etched as far as the part of the gate insulating film 144, i.e., the part of the gate insulating film 144 remaining. The second contact hole 138 penetrates the second passivation film 152 as far as the data pad lower electrode 136 or the ohmic contact layer 146 to expose the side surface of the data pad lower electrode 136. In this case, the active layer 116 exposed through the drain contact hole 114 and the second contact hole 138 plays the role of an etch stopper. Alternatively, the drain contact hole 114 and the second contact hole 138 might be formed to penetrate only the first and second passivation films 150, 152.

Referring to FIG. 8D, the ashing process thins the first photo-resist pattern 240A and the second photo-resist pattern 240B is removed. The second passivation film 152 is etched by the dry etching process using the ashed first photo-resist pattern 240A as a mask, thereby forming the pixel hole 170 in the pixel area. The pixel hole 170 is formed in the pixel area to expose the drain electrode 112 and the first passivation film 150.

Specifically, the second passivation film 152 is etched by a wet etching process using a HF group and/or an $NH_4F$ group etchant, for example, a buffered oxide etchant (hereinafter, referred to as "BOE"). The second passivation film 152 is anisotropically etched by the wet etching, thus the second passivation film 152 is over-etched than the first photo-resist pattern 240A. The first passivation film 150 exposed through the drain contact hole 114 and the first and second contact holes 130, 138 is also etched, but the etching rate of the second passivation film 152 is higher than that of the first passivation film 150. Thus, the side surface of the second passivation film 152 has a gentler tilt angle than the side surface of the first passivation film 150. In an embodiment, the second passivation film 152 has its upper part over-etched versus its lower part in a horizontal direction by an etchant that penetrates into a bordering surface between the first photo-resist pattern 240A and the second passivation film 152. Accordingly, the side surface of the patterned second passivation film 152 is removed inward by as much as ΔP in the horizontal direction in comparison with the edge part of the first photo-resist pattern 240A. Also, the side surface of the second passivation film 152 has a gentle tilt angle, for example, a tilt angle θ of 15°-45° range. As a result, ΔP is greater than in a case of dry-etching the second passivation film 152, thus it is possible to improve the efficiency of the process of removing the first photo-resist pattern 240A.

Referring to FIG. 8E, a transparent conductive film 117 is formed on the entire surface of the first photo-resist pattern 240A by a deposition method such as sputtering. The transparent conductive film 117 is formed of ITO, TO, IZO or ITZO. Subsequently, the first photo-resist pattern 240A over which the transparent conductive film 117 is formed is removed by the stripping process as in FIG. 8F. Accordingly, the transparent conductive pattern, i.e., the pixel electrode 118, the gate pad upper electrode 132, the data pad upper electrode 140 is formed inside the pixel hole 170 and the first and second contact holes 130, 138. The pixel electrode 118 formed inside the pixel hole 170 is connected to the drain electrode 112 through the drain contact hole 114, and the data pad upper electrode 140 formed inside the second contact hole 138 is connected to the data pad lower electrode 136.

The transparent conductive pattern is deposited even on the side surface of the second passivation film 152, thus exposing the metal layer under the transparent conductive pattern is prevented. Herein, the transparent conductive pattern has a structure wherein its thickness is gradually decreased as it goes up along the side surface of the first and second passivation films 150, 152. Further, the transparent conductive pattern has an open structure with the transparent conductive film 117 which is deposited on the first photo-resist pattern 240, as shown in FIG. 8E, by a distance ΔP between the side surface of the second passivation film 152 and the edge part of the first photo-resist pattern 240A. Accordingly, during a stripping process to remove the first photo-resist pattern 240A over which the transparent conductive film 117 is formed, it becomes easy to penetrate between the first photo-resist pattern 240A and the second passivation film 152. Thus, the efficiency of the lift-off is improved. Further, the pixel electrode 118 is formed on the first passivation film 150, thus it is possible to prevent a rubbing defect caused by the step difference and it is possible to form a storage capacitor 120 by overlapping the gate line and to improve an aperture ratio.

Figure 9A:
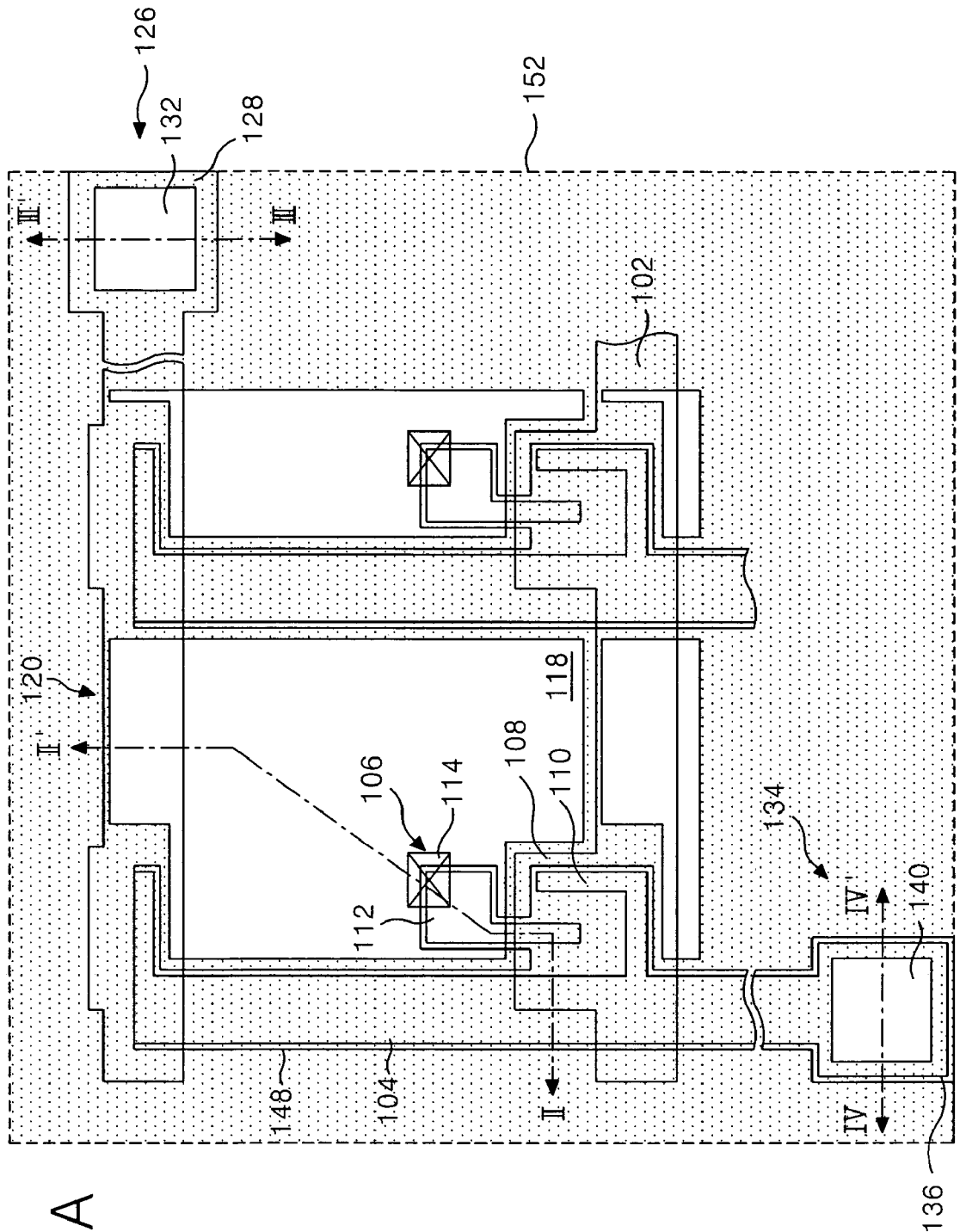
FIGS. 9A to 9C are plan views illustrating various locations of a drain contact hole in the thin film transistor shown in FIG. 2.
Figure 9B:
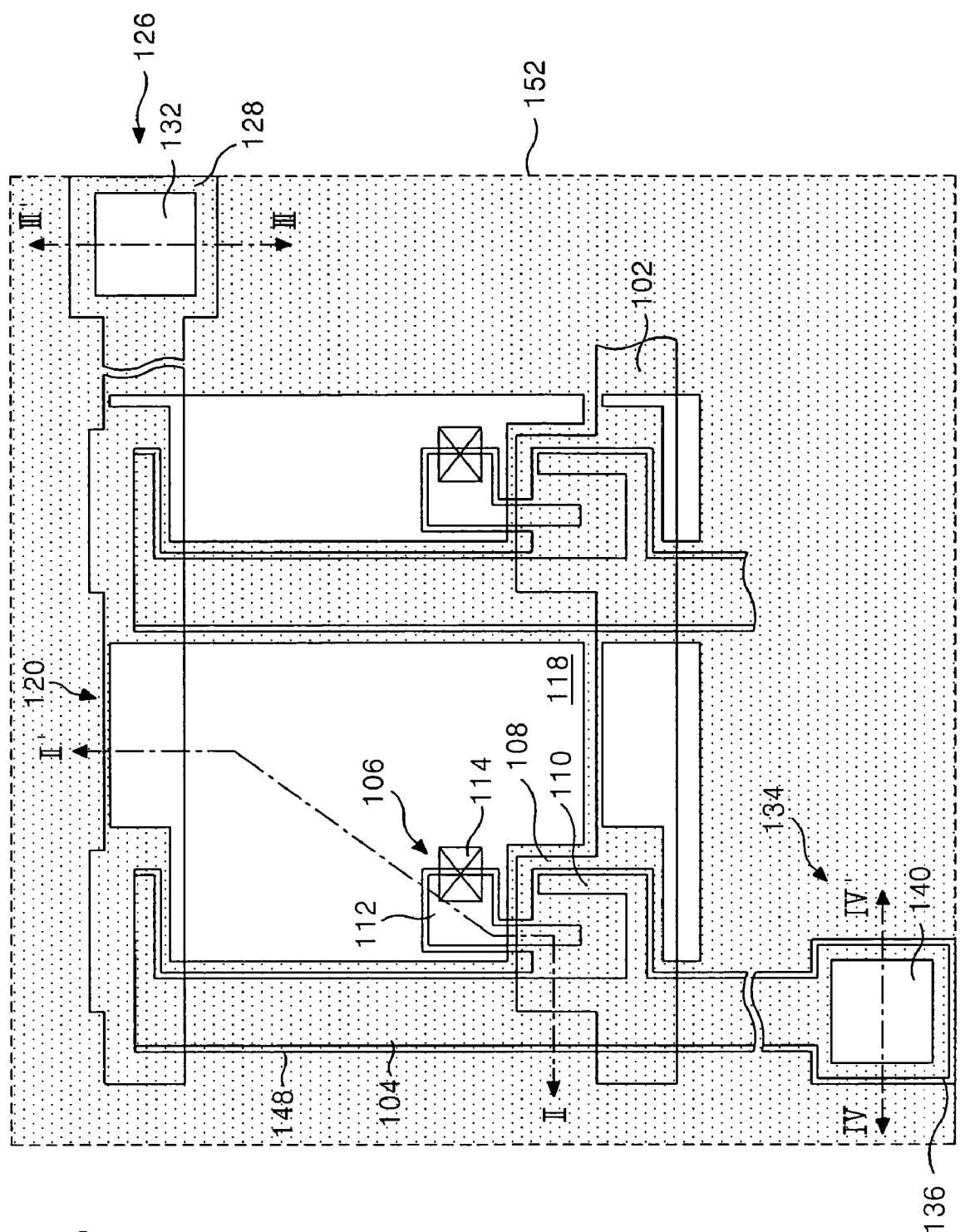
Figure 9C:
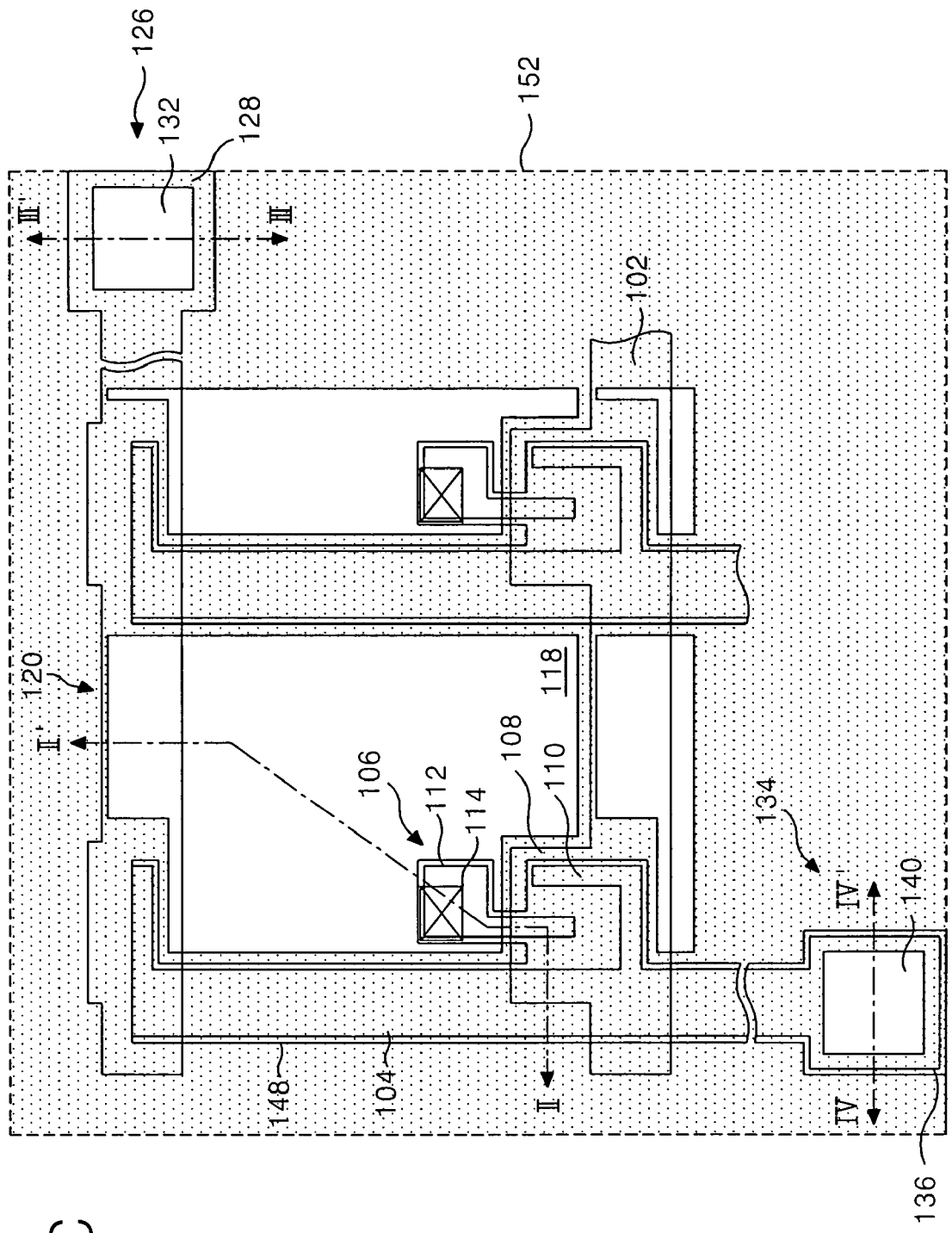

FIGS. 9A to 9C diversely illustrate the location of the drain contact hole 114 in the thin film transistor substrate shown in FIG. 2.

The drain contact hole 114 is formed to penetrate the right-upper part of the drain electrode 112, as shown in FIG. 9A. The drain contact hole 114 may also be formed to penetrate the right side part, as shown in FIG. 9B, or to penetrate the left-upper part of the drain electrode 112, as shown in FIG. 9C.

Figure 10:
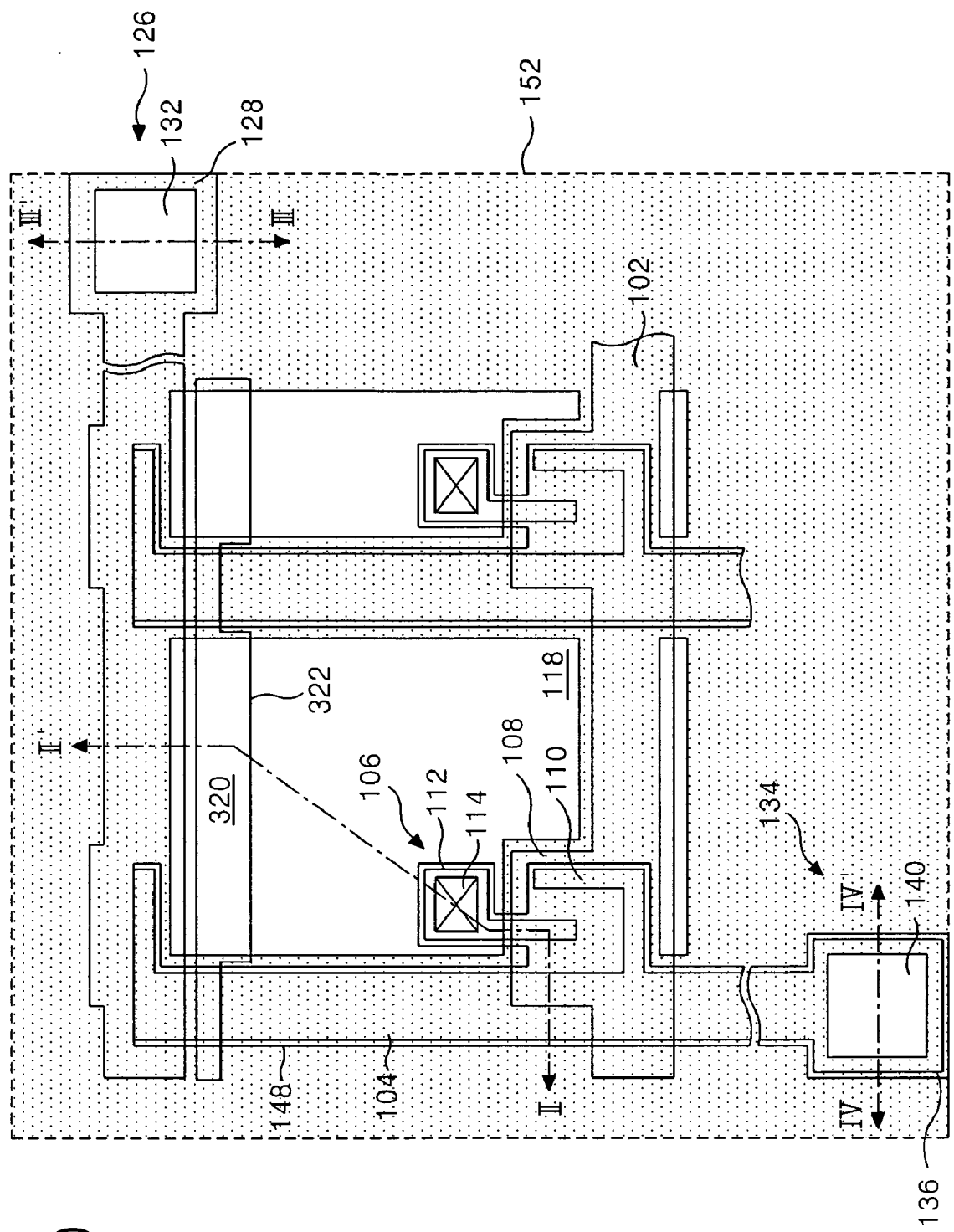
FIG. 10 is a plan view illustrating part of a thin film transistor substrate according to another embodiment of the present invention.
Figure 11A:
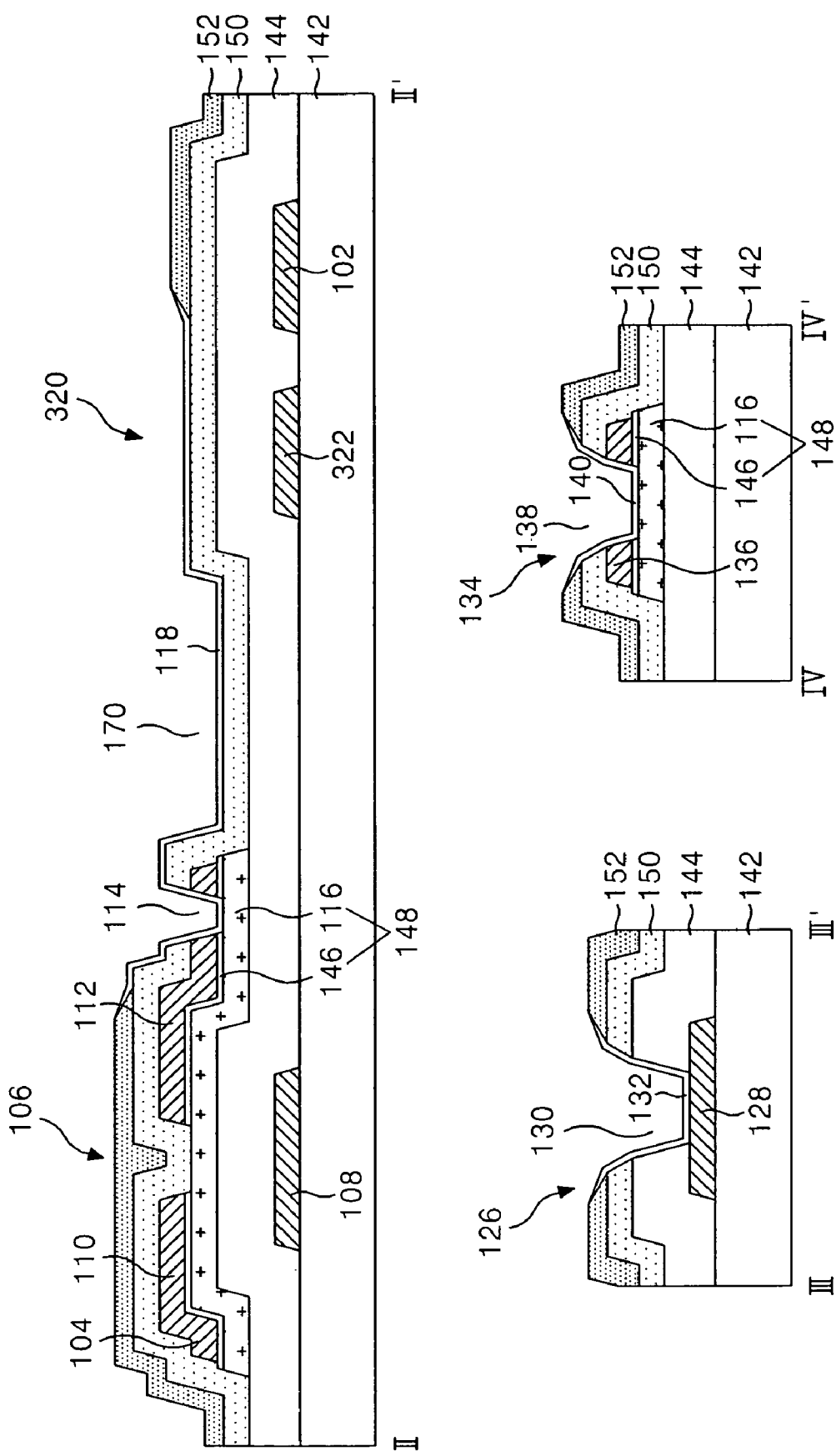

FIG. 10 is a plan view partially illustrating a thin film transistor substrate according to another embodiment of the present invention, and FIGS. 11A and 11B are sectional diagrams illustrating the thin film transistor substrate shown in FIG. 10, taken along the lines II-II', III-III', IV-IV'.

The thin film transistor substrate shown in FIGS. 10 to 11B includes the same components as the thin film transistor substrate shown in FIGS. 2 to 3B except that a storage capacitor 320 is formed in a storage-on-common structure. Accordingly, the description for the repeated components will be omitted.

The thin film transistor substrate shown in FIGS. 10 to 11B further includes a storage line 322 that is formed on a substrate 142 to be parallel to the gate line 102, i.e., to cross the pixel area. The storage line 322 is formed together with the gate line 102 in the foregoing first mask process. Accordingly, the pixel electrode 118 overlaps the storage line 322, wherein the gate insulating film 144 and the first passivation film 150 are formed therebetween, to thereby form a storage capacitor 320 in the storage-on-common structure. The storage capacitor 320 may be formed by leaving the first passivation film 150 and the gate insulating film 144 when forming the pixel hole 170 in the third mask process as described above. The pixel electrode 118 is formed to not overlap or to partially overlap the gate line 102. The drain contact hole 114 and the second contact hole 138 penetrate as far as the ohmic contact hole 146 to expose the side surface of the drain electrode 112 and the data pad lower electrode 136. The drain contact hole 114 and the second contact hole 138 may also penetrate as far as the first passivation film 150 to expose the surface of the drain electrode 112 and the data pad lower electrode 136.

Figure 12:
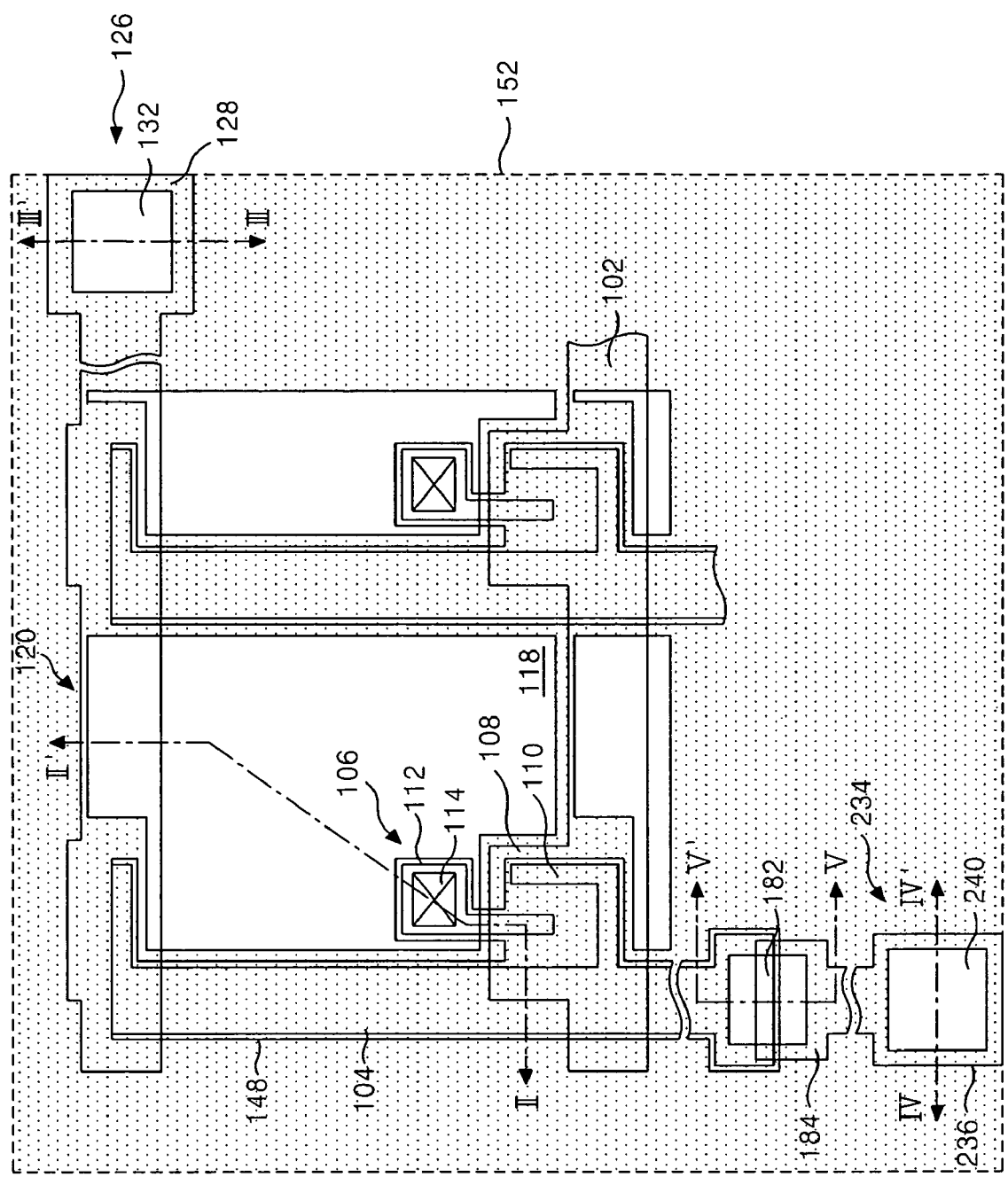
FIG. 12 is a plan view illustrating part of a thin film transistor substrate according to yet another embodiment of the present invention.
Figure 13A:
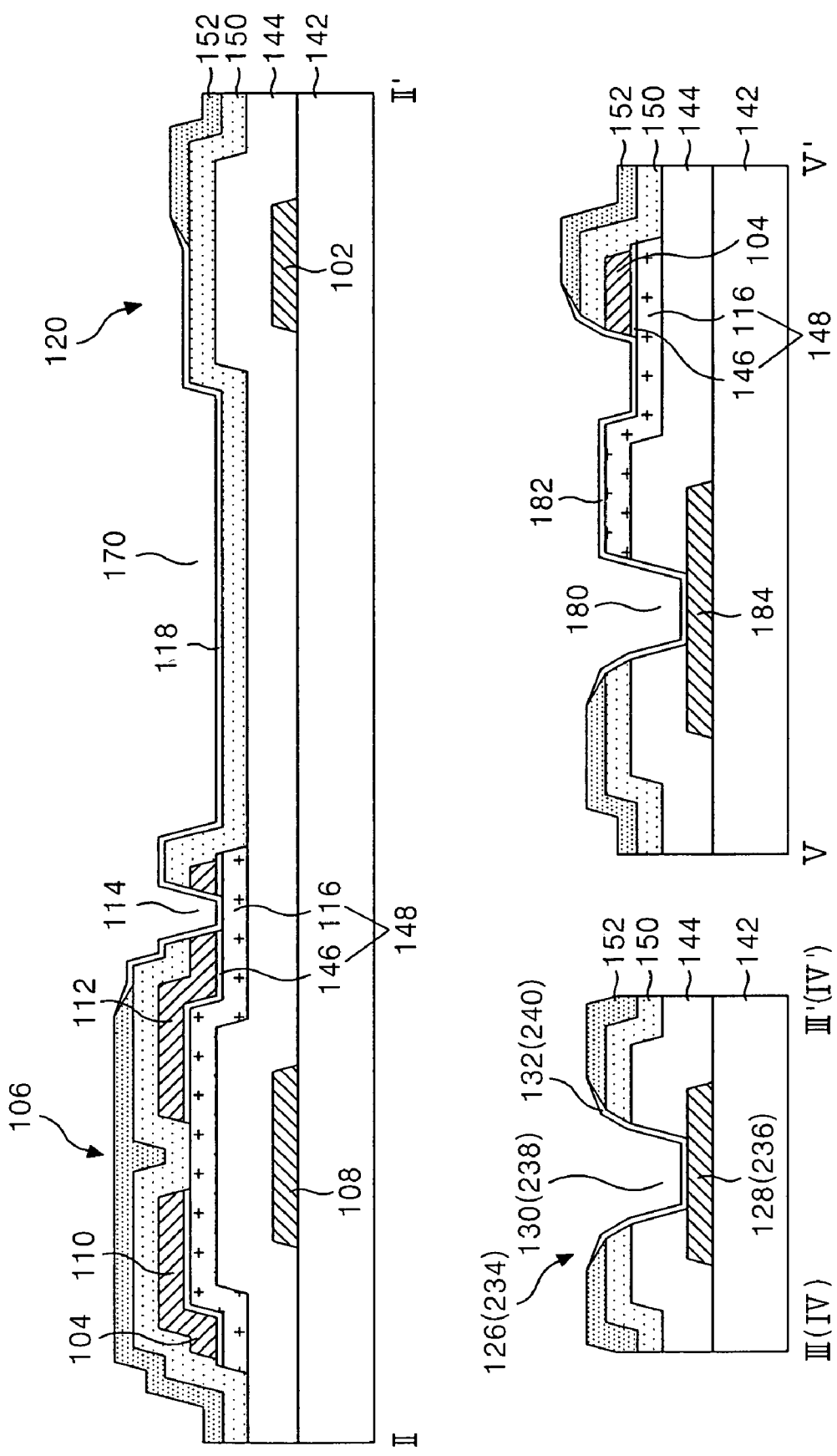

FIG. 12 is a plan view partially illustrating a thin film transistor substrate according to yet another embodiment of the present invention, and FIGS. 13A and 13B are sectional diagrams illustrating the thin film transistor substrate shown in FIG. 12, taken along the lines II-II', III-III', IV-IV', V-V'.

The thin film transistor substrate shown in FIGS. 12 to 13B includes the same components as the thin film transistor substrate shown in FIGS. 2 to 3B except that a data pad 234 is formed in the same structure as the gate pad 126 to be connected to the data line 104 through the contact electrode 182. Accordingly, the description for the repeated components will be omitted.

The data pad 234 shown in FIGS. 12 to 13B is formed in the same structure as the gate pad 126. In other words, the data pad 234 includes a data pad lower electrode 236 formed on the substrate 142; and a data pad upper electrode 240 which is formed inside a second contact hole 238 that penetrates the second passivation film 152 as far as the gate insulating film 144 and is connected to the data pad lower electrode 236. Herein, the data pad upper electrode 240 is formed in a shape that its thickness is decreased along the gentle side surface of the second passivation film 152 to form a border with the second passivation film 152.

The data line 104 is connected to the data pad 234 through the contact electrode 182 and the data link 184. The data link 184 is extended from the data pad lower electrode 236 to partially overlap or to be adjacent to the data line 104. The third contact hole 180 exposes data line 104 and the data link 184 which are adjacent thereto. The third contact hole 180 penetrates as far as the ohmic contact layer 146 to expose the side surface of the data line 104 as shown in FIG. 13A. The third contact hole 180 may also penetrate as far as the first passivation film 150 to expose the surface of the data line 104 as shown in FIG. 13B. The third contact hole 180 is formed in a full exposure area in the third mask process like the other contact holes 114, 130, 238. The contact electrode 182 is formed inside the third contact hole 180 to connect the data line 104 and the data link 184. Herein, the third contact hole 180 is formed to be integrated with the second contact hole 238 to integrate the contact electrode 182 with the data pad upper electrode 240.

Figure 14:
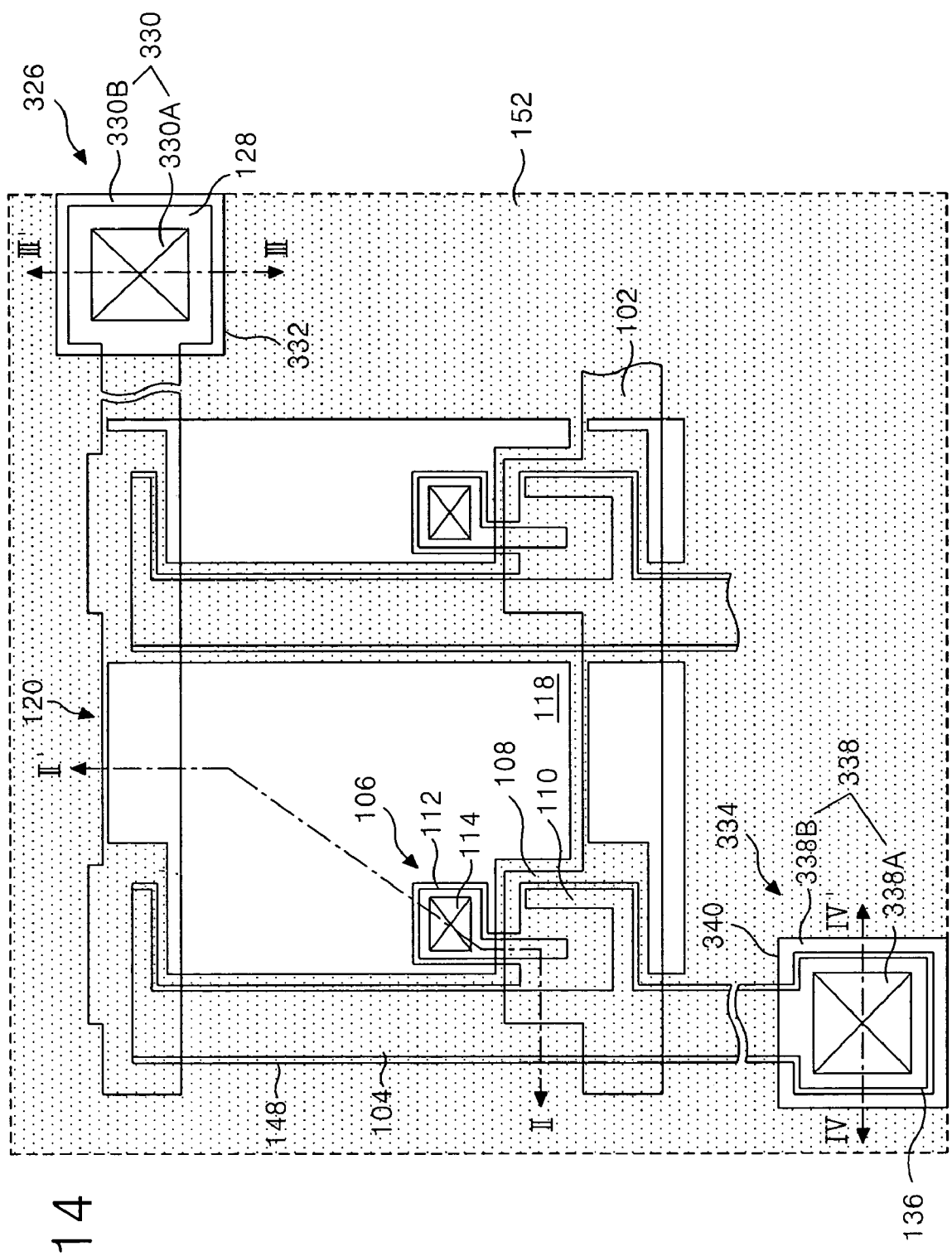
FIG. 14 is a plan view illustrating part of a thin film transistor substrate according to yet another embodiment of the present invention.
Figure 15B:
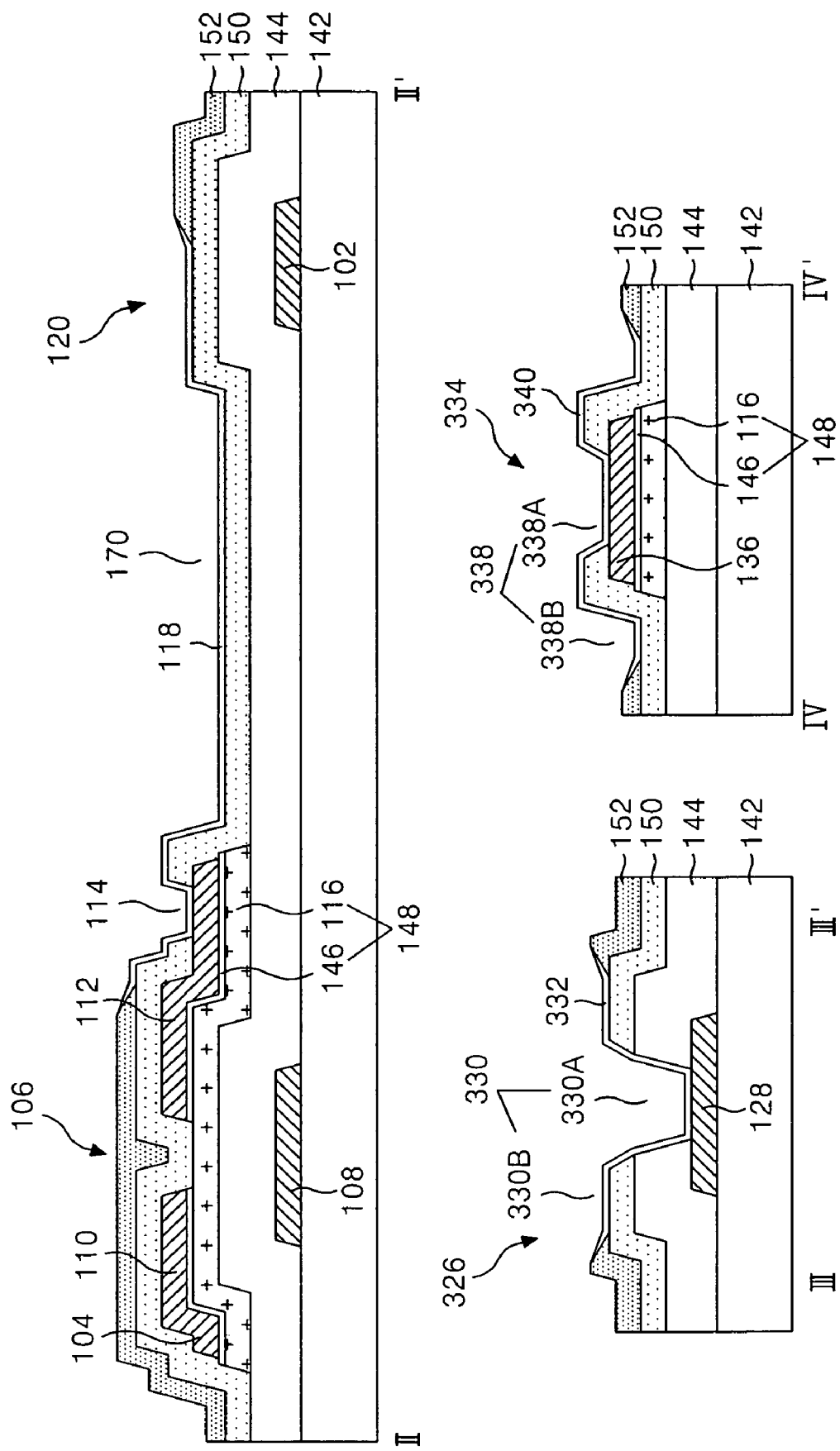

FIG. 14 is a plan view partially illustrating a thin film transistor substrate according to a yet another embodiment of the present invention. FIGS. 15A and 15B are sectional diagrams illustrating the thin film transistor substrate shown in FIG. 14, taken along the lines II-II', III-III', IV-IV'.

The thin film transistor substrate shown in FIGS. 14 to 15B includes the same components as the thin film transistor substrate shown in FIGS. 2 to 3B except that first and second contact holes 330, 338 are formed in a double structure, such that their depths are different. Accordingly, the description for the repeated components will be omitted. Gate pad 326 and data pad 334 are shown.

The first contact hole 330 shown in FIGS. 14 and 15B includes contact holes 330A, 330B with different depths. That is, the first contact hole 330 includes contact hole 330A which penetrates the second passivation film 152 and the gate insulating film 144 to expose the gate pad lower electrode 128; and contact hole 330B penetrates only the second passivation film 152 to expose the first passivation film 150. Herein, contact hole 330B encompasses contact hole 330A. Accordingly, the gate pad upper electrode 332 formed inside the first contact hole 330 is connected to the gate pad lower electrode 128 through contact hole 330A. Gate pad upper electrode 332 is also put on the first passivation film 150 through contact hole 330B, and forms a border with the side surface of the second passivation film 152. Accordingly, the gate pad upper electrode 332 formed inside the first contact hole 330 is formed to have a wider area than the gate pad lower electrode 128 to increase a contact area with a gate driver.

The second contact hole 338 is formed of overlapping contact holes 338A, 338B having different depths. That is, the second contact hole 338 includes contact hole 338A which penetrates the second passivation film 152 as far as the ohmic contact layer 146 or the first passivation film 150 to expose the data pad lower electrode 136. Contact hole 338B penetrates only the second passivation film 152 to expose the first passivation film 150. Contact hole 338A penetrates as far as the ohmic contact layer 146 to expose the side surface of the data pad lower electrode 136 as shown in FIG. 15A. Contact hole 338A may also penetrate as far as the first passivation film 150 to expose the surface of the data pad lower electrode 136 as shown in FIG. 15B. Contact hole 338B is located in a form of encompassing contact hole 338A. Accordingly, the data pad upper electrode 340 formed inside the second contact hole 338 is connected to the data pad lower electrode 136 through contact hole 338A. Data pad upper electrode 340, is put on the first passivation film 150 through contact hole 338B and forms a border with the side surface of the second passivation film 152.

Accordingly, the data pad upper electrode 340 formed inside the second contact hole 338 is formed to have a wider area than the data pad lower electrode 136 to increase the contact area with a data driver.

In the first and second contact holes 330, 338, contact holes 330A, 338A are formed in the full exposure area in the third mask process like the drain contact hole 114. Contact holes 330B, 338B are formed in a halftone exposure area like the pixel hole 170.

Figure 16:
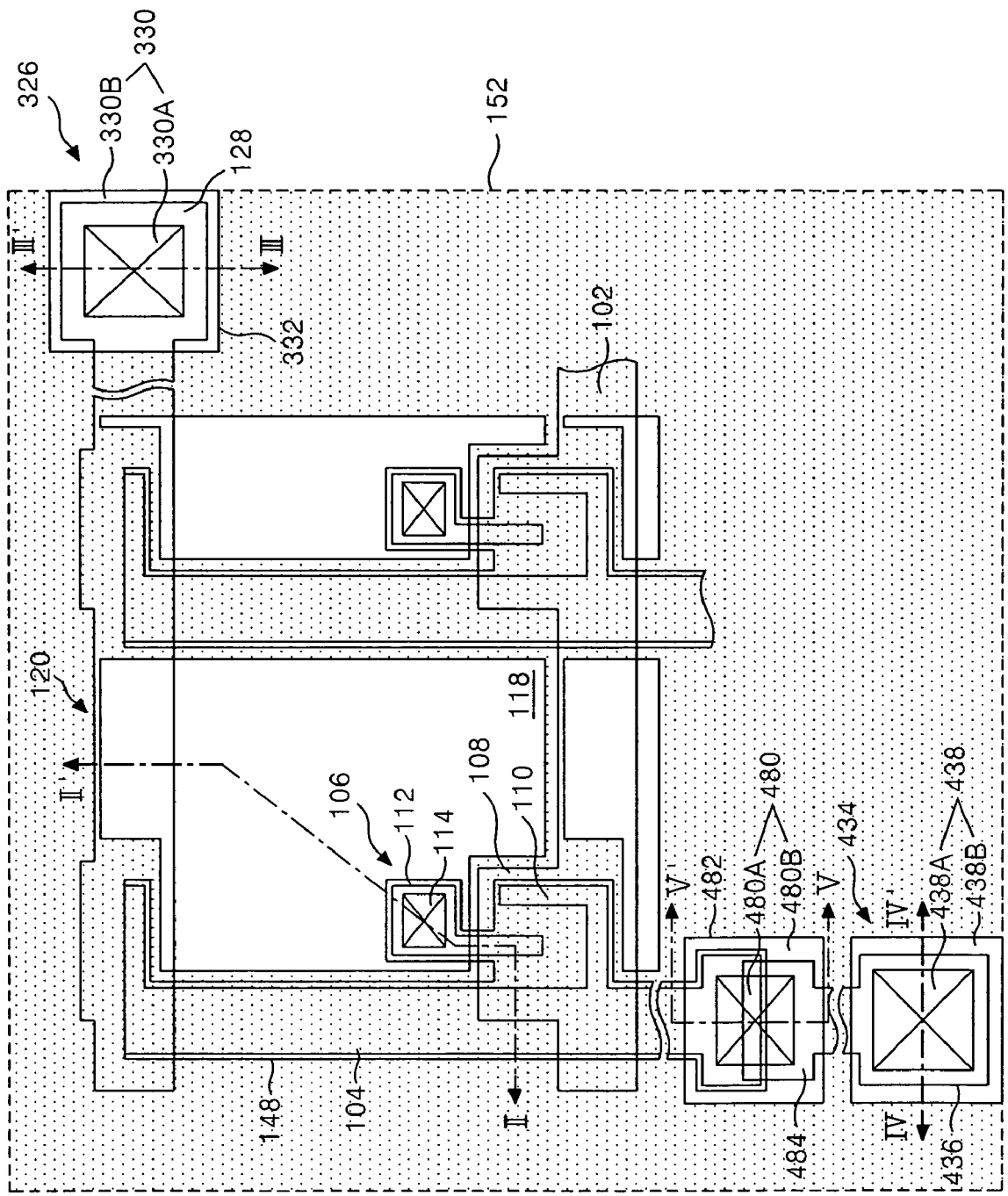
FIG. 16 is a plan view illustrating part of a thin film transistor substrate according to yet another embodiment of the present invention.
Figure 17A:
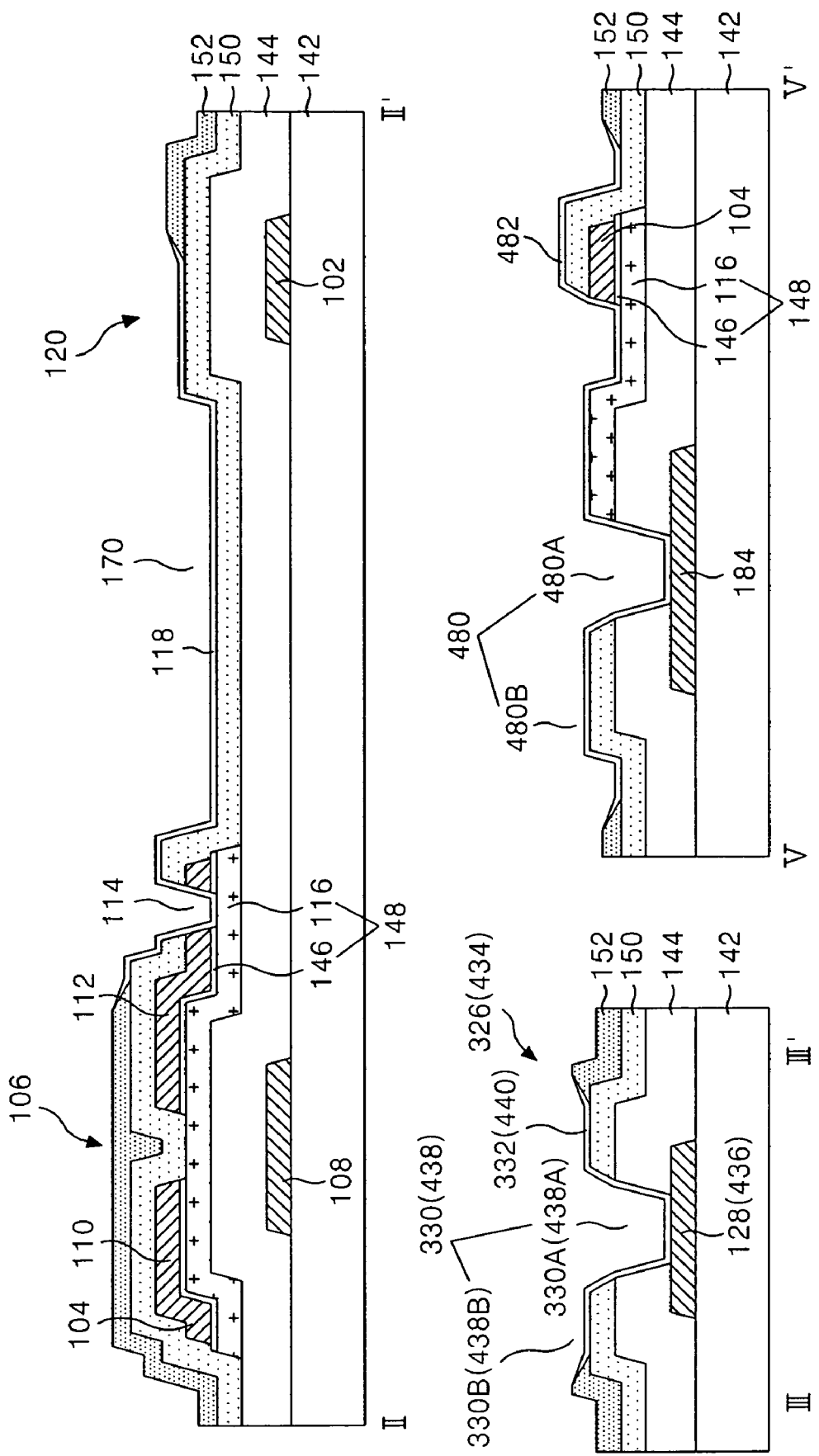
FIGS. 17A and 17B are sectional diagrams illustrating the thin film transistor substrate shown in FIG. 16, taken along the lines II-II', III-III', IV-IV', V-V'.
Figure 17B:
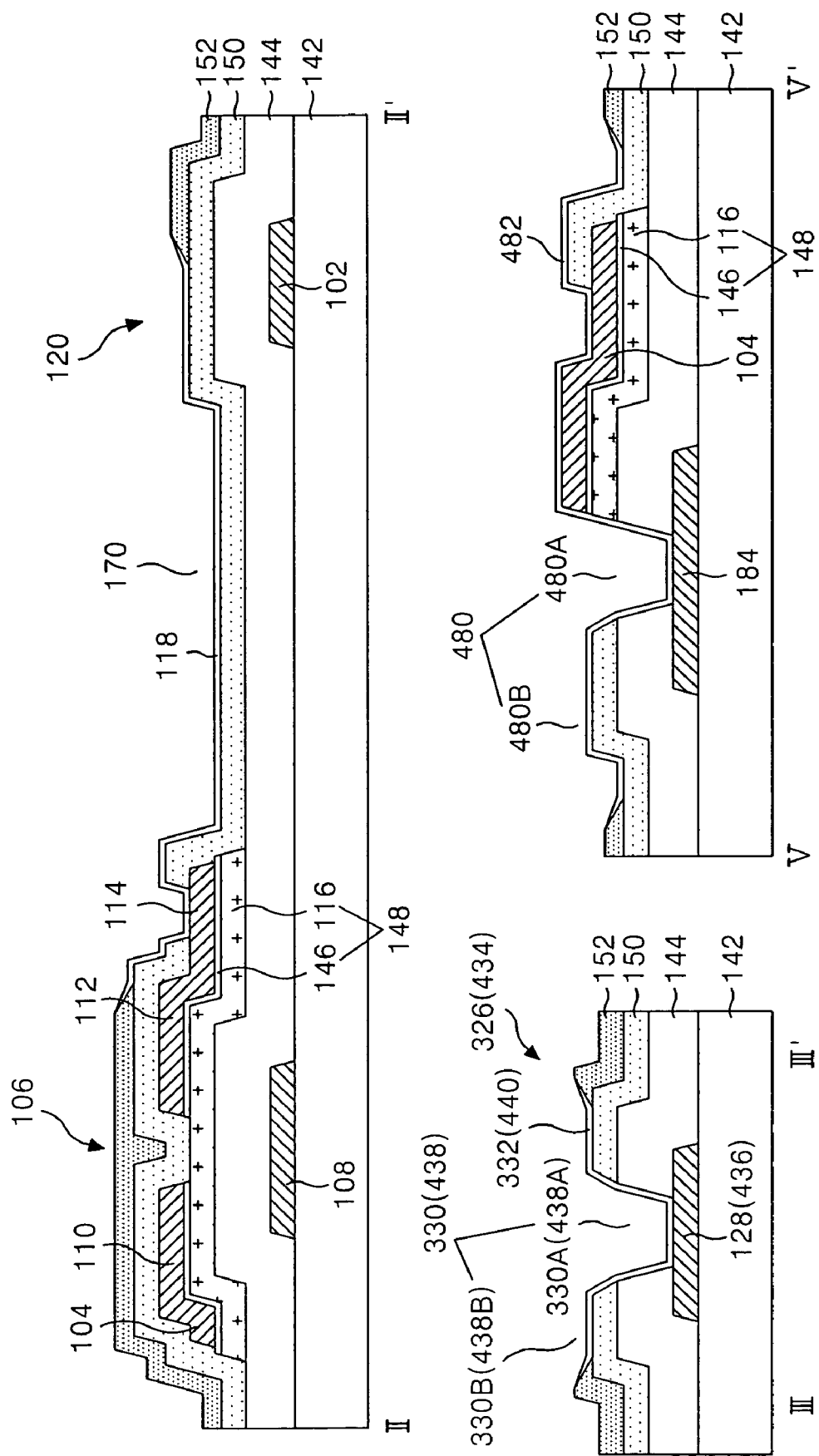

FIG. 16 is a plan view partially illustrating a thin film transistor substrate according to yet another embodiment of the present invention. FIGS. 17A and 17B are sectional diagrams illustrating the thin film transistor substrate shown in FIG. 16, taken along the lines II-II', III-III', IV-IV', V-V'.

The thin film transistor substrate shown in FIGS. 16 to 17B includes the same components as the thin film transistor substrate shown in FIGS. 14 to 15B except that a data pad 434 is formed in the same structure as a gate pad 326 of FIG. 14 to be connected to the data line 104 through the contact electrode 482. Accordingly, the description for the repeated components will be omitted.

The data pad 434 shown in FIGS. 16 to 17B is formed in the same structure as the gate pad 326 of FIG. 14. That is, the data pad 434 includes a data pad lower electrode 436 formed on the substrate 142; and a data pad upper electrode 440 which is formed inside a second contact hole 438 that exposes the data pad lower electrode 436. Herein, the second contact hole 438 includes contact hole 438A which penetrates the second passivation film 152 as far as the gate insulating film 144; and contact hole 438B which penetrates the second passivation film 152 to expose the first passivation film 150. Accordingly, the data pad upper electrode 440 formed inside the second contact hole 438 is connected to the data pad lower electrode 436 through the contact hole 438A. Data pad upper electrode 440 is put on the first passivation film 150 through contact hole 438B, and forms a border with the side surface of the second passivation film 152. Accordingly, the data pad upper electrode 440 formed inside the second contact hole 438 is formed to have a wider area than the data pad lower electrode 436 to increase the contact area with a data driver.

The data line 104 is connected to the data pad 434 through the contact electrode 482 and the data link 484. The data link 484 extends from the data pad lower electrode 436 to partially overlap or to be adjacent to the data line 104. The third contact hole 480 exposes the data line 104 and the data link 484 which are adjacent thereto. The third contact hole 480 includes contact hole 480A which exposes a data link 484 and the data line 104; and contact hole 480B which exposes the first passivation film 150. Contact hole 480A penetrates as far as the ohmic contact layer 146 to expose the side surface of the data line 104 as shown in FIG. 17A, or penetrates as far as the first passivation film 150 to expose the surface of the data line 104 as shown in FIG. 17B. Contact hole 480B is located in a form of encompassing contact hole 480A. Accordingly, a contact electrode 482 formed inside the third contact hole 480 is connected to the data link 484 and the data line 104 through contact hole 480A and is put on the first passivation film 150 through contact hole 480B. Contact electrode 482 forms a border with the side surface of the second passivation film 152. Accordingly, it is formed to have a wider line width than the data link 484 and the data line 104 which are formed inside the third contact hole 480.

Contact hole 480A in the third contact hole 480 is formed in the full exposure area in the third mask process like the drain contact hole 114, and contact hole 480B is formed in the halftone exposure area like the pixel hole 170.

The third contact hole 480 is integrated in a structure with the second contact hole 438, thus the contact electrode 482 can be integrated with the data pad upper electrode 440.

As described above, the thin film transistor substrate and the fabricating method thereof according to the present invention can form the pixel hole and the contact holes to have different depths, by one mask process using a halftone mask or diffractive exposure mask. The transparent conductive film is patterned by the lift-off of the photo-resist pattern used when patterning the passivation film, thereby forming the transparent conductive pattern. Accordingly, the fabricating method of the thin film transistor substrate of the present invention simplifies processing to three mask processes.

Further, the thin film transistor substrate and the fabricating method thereof according to the present invention have the first passivation film and the gate insulating film existing under the pixel electrode. Accordingly, it is possible to prevent alignment defects caused by the step difference of the pixel electrode. Further, it is possible to form the storage capacitor which has the storage-on-gate structure by overlapping the pixel electrode and the gate line. It is also possible to form the storage capacitor which has the storage-on-common structure by overlapping the pixel electrode and the storage line. In addition, the pixel electrode can overlap with the gate line, thus an aperture ratio of the pixel electrode can be improved.

Further, the thin film transistor substrate and the fabricating method thereof according to the present invention performs the wet etching on the second passivation film to increase the over-etched depth $\Delta P$ of the second passivation film, thereby improving the lift-off efficiency of the photo-resist pattern where the transparent conductive film is deposited. Further, the side surface of the second passivation film which has a higher etching rate than the first passivation film is made to have the gentle tilt surface, thus the transparent conductive pattern is made to sufficiently cover the tilt surface, thereby preventing electrolytic corrosion problems caused by the exposure of the metal layer.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display device, comprising:
   a gate line on a substrate;
   a data line crossing the gate line with a gate insulating film in between to define a pixel area;
   a thin film transistor connected to the gate line and the data line;
   a semiconductor pattern overlapping along the data line;
   a double layer passivation film covering the data line and the thin film transistor, wherein layers of the passivation film have different etching rates; and
   a pixel electrode formed in a pixel hole penetrating an upper passivation film of the double layer passivation film and connected to a drain electrode of the thin film transistor exposed through a drain contact hole, the pixel electrode forming a border with the upper passivation film surrounding the pixel hole.

2. The device according to claim 1, further comprising:
   a storage capacitor formed by overlapping the pixel electrode with the gate line with the gate insulating film and a lower passivation film of the double layer passivation film in between.

3. The device according to claim 1, further comprising:
   a storage line crossing the data line across the pixel area; and
   a storage capacitor formed by overlapping the storage line with the pixel electrode with the gate insulating film and a lower passivation film of the double layer passivation film.

4. The device according to claim 3, wherein the pixel electrode overlaps a part of the gate line.

5. The device according to claim 1, wherein the drain contact hole penetrates at least one of the double layer passivation film, the drain electrode and a part of a semiconductor pattern under the drain electrode to expose the drain electrode.

6. The device according to claim 1, further comprising:
   a pad connected to at least one of the gate line and the data line,
   wherein the pad includes:
   a pad lower electrode connected to at least one of the gate line and the data line;
   a contact hole exposing the pad lower electrode; and
   a pad upper electrode connected to the pad lower electrode through the contact hole.

7. The device according to claim 6, wherein the pad upper electrode is formed in the contact hole and forms a border with the side surface of the upper passivation film of the double layer passivation film surrounding the contact hole.

8. The device according to claim 6, further comprising:
   a second contact hole integrated with the contact hole to expose a lower passivation film of the double layer passivation film.

9. The device according to claim 8, wherein the second contact hole surrounds the contact hole.

10. The device according to claim 8, wherein the pad upper electrode extends through the second contact hole to be disposed on the lower passivation film.

11. The device according to claim 10, wherein the pad upper electrode forms a border with a side surface of the upper passivation film of the double layer passivation film surrounding the second contact hole.

12. The device according to claim 10, wherein the pad upper electrode has a wider area than the pad lower electrode.

13. The device according to claim 6, wherein the pad lower electrode is formed on the substrate, and the contact hole penetrates the double layer passivation film and the gate insulating film to expose the pad lower electrode.

14. The device according to claim 13, further comprising:
   a data link extending from the pad lower electrode, the data link connected to the data line and being adjacent to the data line;
   a second contact hole exposing the data line and the data link; and
   a contact electrode connecting the data line and the data link though the second contact hole.

15. The device according to claim 14, wherein the contact electrode is formed in the second contact hole and forms a border with a side surface of the upper passivation film of the double layer passivation film surrounding the second contact hole.

16. The device according to claim 14, further comprising:
a third contact hole integrated with the second contact hole to expose a lower passivation film of the double layer passivation film.

17. The device according to claim 16, wherein the third contact hole surrounds the second contact hole.

18. The device according to claim 17, wherein the contact electrode extends through the third contact hole to be disposed on the lower passivation film.

19. The device according to claim 17, wherein the contact electrode forms a border with a side surface of the upper passivation film of the double layer passivation film surrounding the third contact hole.

20. The device according to claim 14, wherein the second contact hole penetrates at least one of the data line and the semiconductor pattern to expose a side surface of the data line.

21. The device according to claim 6, wherein the pad lower electrode connected to the data line is formed on the gate insulating film in a structure with the semiconductor pattern, and the contact hole penetrates the double passivation film to expose the pad lower electrode.

22. The device according to claim 21, wherein the contact hole penetrates at least one of the data pad lower electrode and a part of the semiconductor pattern to expose a side surface of the data pad lower electrode.

23. The device according to claim 6, wherein a side surface of the upper passivation film of the double layer passivation film surrounding the contact hole has a lower tilt angle than that of the lower passivation film.

24. The device according to claim 23, wherein the side surface of the upper passivation film has a tilt angle of 15°-45°.

25. The device according to claim 23, wherein at least one of the pixel electrode, the pad upper electrode and a contact electrode has its thickness decreased as it goes upward on the side surface of the upper passivation film.

26. The device according to claim 8, wherein a side surface of the upper passivation film of the double layer passivation film surrounding the contact hole has a lower tilt angle than that of the lower passivation film.

27. The device according to claim 26, wherein the side surface of the upper passivation film has a tilt angle of 15°-45°.

28. The device according to claim 26, wherein at least one of the pixel electrode, the pad upper electrode and a contact electrode where its thickness decreases as it goes upward on the side surface of the upper passivation film.

29. The device according to claim 14, wherein a side surface of the upper passivation film of the double layer passivation film surrounding the contact hole has a lower tilt angle than that of a lower passivation film.

30. The device according to claim 29, wherein the side surface of the upper passivation film has a tilt angle of 15°-45°.

31. The device according to claim 29, wherein at least one of the pixel electrode, the pad upper electrode and the contact electrode where its thickness decreases as it goes upward on the side surface of the upper passivation film.

32. The device according to claim 16, wherein a side surface of the upper passivation film of the double layer passivation film surrounding the contact hole has a lower tilt angle than that of a lower passivation film.

33. The device according to claim 32, wherein the side surface of the upper passivation film has a tilt angle of 15°-45°.

34. The device according to claim 32, wherein at least one of the pixel electrode, the pad upper electrode and the contact electrode where its thickness decreases as it goes upward on the side surface of the upper passivation film.

35. The device according to claim 21, wherein a side surface of the upper passivation film of the double layer passivation film surrounding the contact hole has a lower tilt angle than that of a lower passivation film.

36. The device according to claim 35, wherein the side surface of the upper passivation film has a tilt angle of 15°-45°.

37. The device according to claim 35, wherein at least one of the pixel electrode, the pad upper electrode and a contact electrode where its thickness decreases as it goes upward on the side surface of the upper passivation film.

38. The device according to claim 1, wherein a lower passivation film of the double layer passivation film is formed of SiOx, and the upper passivation film is formed of SiNx.

39. The device according to claim 1, wherein the upper and lower passivation films of the double layer passivation film are formed of SiNx, the upper passivation film having a higher nitrogen content than the lower passivation film.

40. The device according to claim 1, wherein the upper and lower passivation films of the double layer passivation film are formed of SiNx, the lower passivation film having a higher silicon content than the upper passivation film.

41. A method of fabricating a liquid crystal display device, comprising:
a first mask process of forming a gate line on a substrate and a gate electrode connected to the gate line;
a second mask process of forming a gate insulating film covering the gate line and the gate electrode, a semiconductor pattern on the gate insulating film, a data line crossing the gate line on the semiconductor pattern to define a pixel area, a source electrode connected to the data line, and a drain electrode facing the source electrode;
a third mask process of forming a double layer passivation film which covers the data line, the source electrode and the drain electrode, a pixel hole penetrating an upper passivation film of the double layer passivation film in the pixel area, a drain contact hole exposing the drain electrode, and a pixel electrode formed in the pixel hole connected to the exposed drain electrode, the pixel electrode forming a border with a side surface of the upper passivation film surrounding the pixel hole.

42. The method according to claim 41, wherein the third mask process further includes:
forming a storage capacitor by overlapping the pixel electrode with the gate line with the gate insulating film and a lower passivation film of the double layer passivation film.

43. The method according to claim 41, wherein the first mask process further includes forming a storage line parallel to the gate line on the substrate, and
wherein the third mask process further includes forming a storage capacitor by overlapping the pixel electrode with the storage line with the gate insulating film and a lower passivation film of the double layer passivation film in between.

44. The method according to claim 41, wherein the first mask process further includes forming a pad lower electrode connected to at least one of the gate line and the data line on the substrate, and
wherein the third mask process further includes forming a contact hole exposing the pad lower electrode; and forming a pad upper electrode connected to the pad lower electrode through the contact hole.

45. The method according to claim 41, wherein the second mask process further includes:
forming a pad lower electrode extending from the data line together with the semiconductor pattern, and
wherein the third mask process further includes:
forming a contact hole penetrating the double layer passivation film to expose the pad lower electrode; and
forming a pad upper electrode in the contact hole to be connected to the pad lower electrode.

46. The method according to claim 44, wherein the pad upper electrode is formed in the contact hole and forms a border with a side surface of the upper passivation film of the double layer passivation film surrounding the contact hole.

47. The method according to claim 45, wherein the pad upper electrode is formed in the contact hole and forms a border with a side surface of the upper passivation film of the double layer passivation film surrounding the contact hole.

48. The method according to claim 44, wherein the contact hole penetrates the double layer passivation film and the gate insulating film to expose the pad lower electrode.

49. The method according to claim 45, wherein the contact hole is formed to penetrate as far as one of the pad lower electrode and part of the semiconductor pattern to expose the pad lower electrode.

50. The method according to claim 44, wherein the third mask process includes:
forming a photo-resist pattern with a different thickness on the double layer passivation film by a photolithography process using at least one of a diffractive exposure mask and a halftone mask;
forming the drain contact hole, the pixel hole and the contact hole by an etching process using the photo-resist pattern with the different thickness as a mask;
forming a transparent conductive film covering the photo-resist pattern, and forming the pad upper electrode and the pixel electrode, which are separated from the transparent conductive film in the pixel hole and the contact hole; and
lifting off the photo-resist pattern over the transparent conductive film.

51. The method according to claim 50, wherein the upper passivation film of the double layer passivation film where the pixel hole and the contact hole are formed is over-etched versus the photo-resist pattern.

52. The method according to claim 50, wherein a side surface of upper passivation film of the double layer passivation film where the pixel hole and the contact hole are formed is formed further in a horizontal direction versus an edge of the photo-resist pattern.

53. The method according to claim 50, wherein forming the drain contact hole, the pixel hole and the contact hole includes:
forming the drain contact hole and the contact hole by a first etching process using the photo-resist pattern as a mask; and
forming the pixel hole by a second etching process using the photo-resist pattern.

54. The method according to claim 53, wherein the contact hole is formed where the gate insulating film remains on the pad lower electrode in the first etching process and where the pad lower electrode is exposed in the second etching process.

55. The method according to claim 53, wherein the first etching process includes a dry etching and the second etching process includes a wet etching process.

56. The method according to claim 45, wherein the third mask process includes:
forming a photo-resist pattern with a different thicknesses on the double layer passivation film by a photolithography process using at least one of a diffractive exposure mask and a halftone mask;
forming the drain contact hole, the pixel hole and the contact hole by an etching process using the photo-resist pattern with the different thickness as a mask;
forming a transparent conductive film covering the photo-resist pattern, and forming the pad upper electrode and the pixel electrode, which are separated from the transparent conductive film in the pixel hole and the contact hole; and
lifting off the photo-resist pattern over the transparent conductive film.

57. The method according to claim 56, wherein the upper passivation film of the double layer passivation film where the pixel hole and the contact hole are formed is over-etched versus the photo-resist pattern.

58. The method according to claim 56, wherein the side surface of upper passivation film of the double layer passivation film where the pixel hole and the contact hole are formed is formed further in a horizontal direction than an edge part of the photo-resist pattern.

59. The method according to claim 56, wherein forming the drain contact hole, the pixel hole and the contact hole includes:
forming the drain contact hole and the contact hole by a first etching process using the photo-resist pattern as a mask; and
forming the pixel hole by a second etching process using the photo-resist pattern.

60. The method according to claim 59, wherein the contact hole is formed where the gate insulating film remains on the pad lower electrode in the first etching process and where the pad lower electrode is exposed in the second etching process.

61. The method according to claim 59, wherein the first etching process includes a dry etching and the second etching process includes a wet etching process.

62. The method according to claim 50, wherein the third mask process further includes:
forming a second contact hole integrated with the contact hole to expose a lower passivation film of the double layer passivation film.

63. The method according to claim 62, wherein the second contact hole surrounds the contact hole.

64. The method according to claim 62, wherein the pad upper electrode extends through the second contact hole to be disposed on the lower passivation film.

65. The method according to claim 62, wherein the pad upper electrode forms a border with a side surface of the upper passivation film of the double layer passivation film surrounding the second contact hole.

66. The method according to claim 45, wherein the pad upper electrode has a wider area than the pad lower electrode.

67. The method according to claim 44, wherein the second mask process further includes:
forming a data link extended from the pad lower electrode, the data link being connected to the data line and adjacent to the data line, and
wherein the third mask process further includes:
forming a second contact hole to expose the data line and the data link; and
forming a contact electrode connected to the data line and the data link through the second contact hole.

68. The method according to claim 67, wherein the contact electrode is formed in the second contact hole to form a border with a side surface of the upper passivation film of the double layer passivation film surrounding the second contact hole.

69. The method according to claim 68, wherein the third mask process further includes:

forming a third contact hole integrated with the second contact hole to expose a lower passivation film of the double layer passivation film.

70. The method according to claim 69, wherein the third contact hole surrounds the second contact hole.

71. The method according to claim 69, wherein the contact electrode extends through the third contact hole to be disposed on the lower passivation film.

72. The method according to claim 69, wherein the contact electrode forms a border with a side surface of the upper passivation film of the double passivation film surrounding the third contact hole.

73. The method according to claim 67, wherein the second contact hole penetrates at least one of the data line and the semiconductor pattern to expose a side surface of the data line.

74. The method according to claim 67, wherein a side surface of the upper passivation film of the double layer passivation film that surrounds the contact hole has a lower tilt angle than that of a lower passivation film.

75. The method according to claim 74, wherein the side surface of the upper passivation film is formed to have a tilt angle of 15°-45°.

76. The method according to claim 74, wherein at least one of the pixel electrode, the pad upper electrode and the contact electrode is formed where its thickness decreases as it goes upward on the side surface of the upper passivation film.

77. The method according to claim 41, wherein the double layer passivation film has layers having different etching rates.

78. The method according to claim 41, wherein the double layer passivation film is formed by depositing a lower passivation film and an upper passivation film which has a higher etching rate than the lower passivation film.

79. The method according to claim 78, wherein the lower passivation film is formed of SiOx and the upper passivation film is formed of SiNx.

80. The method according to claim 78, wherein the upper and lower passivation films are formed of SiNx, the upper passivation film having a higher nitrogen content than the lower passivation film.

81. The method according to claim 78, wherein the upper and lower passivation films are formed of SiNx, the lower passivation film having a higher silicon content than the upper passivation film.

82. A method of fabricating a liquid crystal display device, comprising:

forming a gate line and a data line crossing each other with a gate insulating film in between on a substrate to define a pixel area, and a thin film transistor connected to the gate line and the data line;

forming a double layer passivation film having a double structure on the substrate, wherein layers of the passivation film have different etching rates;

forming a photo-resist pattern on the double layer passivation film;

forming a pixel hole penetrating an upper passivation film of the double layer passivation film and a contact hole penetrating the double layer passivation film by wet-etching using the photo-resist pattern as a mask;

forming a transparent conductive film on the photo-resist pattern, and a pixel electrode in the pixel hole to form a border with the upper passivation film, the pixel electrode being connected to the thin film transistor through the contact hole; and lifting-off the photo-resist pattern over the transparent conductive film.

83. The method according to claim 82, wherein the double layer passivation film includes a lower passivation film and an upper passivation film that has a higher etching rate than the lower passivation film.

84. A method of fabricating a liquid crystal display device, comprising:

forming a first conductive layer on a substrate;

forming a lower insulating film covering the first conductive layer;

forming an upper insulating film having a higher etching rate than the lower insulating film;

forming a photo-resist pattern on the upper insulating film;

forming a first hole penetrating the upper and lower insulating films;

forming a second hole to expose the lower insulating film by wet-etching the upper insulating film, and forming a side surface of the upper insulating film that is overetched versus the photo-resist pattern;

forming a second conductive layer covering the photo-resist pattern, and a second conductive pattern, which is separated from the second conductive layer and connected to the first conductive layer through the first hole, in the second hole to form a border with the upper insulating film; and lifting off the photo-resist pattern over the second conductive layer.

* * * * *